United States Patent
Tsuda

(10) Patent No.: US 8,945,306 B2
(45) Date of Patent: Feb. 3, 2015

(54) GAS SUPPLY DEVICE

(75) Inventor: Einosuke Tsuda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 369 days.

(21) Appl. No.: 12/857,895

(22) Filed: Aug. 17, 2010

(65) Prior Publication Data

US 2010/0310772 A1    Dec. 9, 2010

Related U.S. Application Data

(63) Continuation of application No. PCT/JP2009/053022, filed on Feb. 20, 2009.

(30) Foreign Application Priority Data

Feb. 20, 2008   (JP) .................................. 2008-039289

(51) Int. Cl.
   *C23C 16/455*   (2006.01)
   *C23C 16/40*    (2006.01)

(52) U.S. Cl.
   CPC ......... *C23C 16/45544* (2013.01); *C23C 16/409* (2013.01); *C23C 16/45508* (2013.01); *C23C 16/45531* (2013.01); *C23C 16/45559* (2013.01); *C23C 16/45563* (2013.01); *C23C 16/45582* (2013.01)
   USPC ...................................... 118/715; 156/345.33

(58) Field of Classification Search
   CPC ................... C23C 16/45544; C23C 16/45582; C23C 16/45508; C23C 16/45559; C23C 16/45531; C23C 16/409; C23C 16/45563
   USPC ...................................... 118/715; 156/345.33
   See application file for complete search history.

(56) References Cited

U.S. PATENT DOCUMENTS

| | | | | |
|---|---|---|---|---|
| 4,417,692 A | * | 11/1983 | Andrejco et al. | 239/424 |
| 4,421,592 A | * | 12/1983 | Shuskus et al. | 117/103 |
| 5,185,067 A | * | 2/1993 | Shibahara et al. | 427/523 |
| 5,585,968 A | * | 12/1996 | Guhman et al. | 359/654 |
| 5,772,771 A | * | 6/1998 | Li et al. | 118/723 I |
| 5,889,651 A | * | 3/1999 | Sasaki et al. | 361/699 |
| 6,070,551 A | * | 6/2000 | Li et al. | 118/723 I |
| 6,083,344 A | * | 7/2000 | Hanawa et al. | 156/345.28 |
| 6,217,658 B1 | * | 4/2001 | Orczyk et al. | 118/697 |

(Continued)

FOREIGN PATENT DOCUMENTS

| | | |
|---|---|---|
| JP | 57-114225 A | 7/1982 |
| JP | 1-129973 A | 5/1989 |

(Continued)

OTHER PUBLICATIONS

International Search Report for Application No. PCT/JP2009/053022 with English translation mailed on Mar. 31, 2009.

*Primary Examiner* — Jeffrie R Lund
(74) *Attorney, Agent, or Firm* — Abelman, Frayne & Schwab

(57) ABSTRACT

A gas supply device disposed opposite to a substrate mounted on a loading board in a processing container and supplying a process gas for processing the substrate comprises a top plate member having a recess formed to spread gradually toward the state in order to constitute a gas diffusion space at a position facing the substrate on the loading board, and a gas supply nozzle projecting into the recess from the top thereof and having a plurality of gas supply holes along the circumferential direction of the recess.

9 Claims, 17 Drawing Sheets

(56) References Cited

U.S. PATENT DOCUMENTS

| | | | |
|---|---|---|---|
| 6,251,187 B1* | 6/2001 | Li et al. | 118/715 |
| 6,375,744 B2* | 4/2002 | Murugesh et al. | 118/697 |
| 6,540,837 B2* | 4/2003 | Raaijmakers | 118/715 |
| 6,797,639 B2* | 9/2004 | Carducci et al. | 438/710 |
| 7,879,182 B2* | 2/2011 | Ohmi et al. | 156/345.33 |
| 8,110,068 B2* | 2/2012 | Qiu et al. | 156/345.34 |
| 8,481,118 B2* | 7/2013 | Burrows et al. | 427/250 |
| 2002/0088545 A1* | 7/2002 | Lee et al. | 156/345.33 |
| 2002/0179247 A1* | 12/2002 | Davis et al. | 156/345.33 |
| 2003/0041804 A1* | 3/2003 | Shim et al. | 118/723.001 |
| 2003/0041971 A1* | 3/2003 | Kido et al. | 156/345.33 |
| 2003/0127050 A1* | 7/2003 | Kashihara | 118/715 |
| 2006/0157199 A1* | 7/2006 | Kido et al. | 156/345.31 |
| 2006/0263522 A1* | 11/2006 | Byun | 427/248.1 |
| 2007/0187363 A1 | 8/2007 | Oka et al. | |
| 2008/0115729 A1* | 5/2008 | Oda et al. | 118/726 |
| 2008/0156631 A1* | 7/2008 | Fair et al. | 204/164 |
| 2009/0095221 A1* | 4/2009 | Tam et al. | 118/715 |
| 2009/0095222 A1* | 4/2009 | Tam et al. | 118/723 R |
| 2009/0098276 A1* | 4/2009 | Burrows et al. | 427/8 |
| 2009/0236313 A1* | 9/2009 | Qiu et al. | 216/67 |
| 2009/0250334 A1* | 10/2009 | Qiu et al. | 204/164 |
| 2010/0310772 A1* | 12/2010 | Tsuda | 427/255.28 |
| 2012/0024388 A1* | 2/2012 | Burrows et al. | 137/1 |
| 2014/0014745 A1* | 1/2014 | Burrows et al. | 239/548 |

FOREIGN PATENT DOCUMENTS

| | | |
|---|---|---|
| JP | 4-221077 A | 8/1992 |
| JP | 9-186108 A | 7/1997 |
| JP | 2004-91874 A | 3/2004 |
| JP | 2004-288899 A | 10/2004 |
| JP | 2005-507030 A | 3/2005 |
| JP | 2007-24378 A | 2/2007 |
| JP | 2007-243138 A | 9/2007 |
| WO | WO 0166260 A2 * | 9/2001 |
| WO | 03/035927 | 5/2003 |

* cited by examiner (After 0.01 second)

(After 0.1 second)

(After 0.01 second)

(After 0.1 second)

(After 0.05 second)

GAS SUPPLY DEVICE

This is a Continuation of International Application No. PCT/JP2009/053022, filed on 20 Feb. 2009. Priority under 35 U.S.C. §119(a) and 35 U.S.C. §365(b) is claimed from Japanese Application No. 2008-039289, filed 20 Feb. 2008, the disclosure of which is also incorporated herein by reference.

TECHNICAL FIELD

The present disclosure relates to a gas supply device that supplies a process gas into a processing chamber for processing a substrate.

BACKGROUND

In semiconductor manufacture apparatuses, there are a film forming apparatus and an etching apparatus in which a gas supply device is positioned to face a loading board in a processing chamber and supplies a process gas from the gas supply device to a substrate (for example, a semiconductor wafer, hereinafter called "a wafer") mounted on the loading board to process the substrate.

As for the film forming apparatus, there is a thermal CVD apparatus that heats and reacts the process gas. Also, there is known a process so called ALD (Atomic Layer Deposition) or MLD (Molecular Layer Deposition) in which the supply of a plurality of the process gas is divided into two processes (step), and a first process gas is supplied in a first process and a second process gas is supplied in a second process thereby performing each of the first and second processes alternately and laminating the reaction product of the process gas in order. See, for example, paragraph [0002] of Japanese Patent Laid-Open Publication No. 2004-91874. Regarding ALD, there is known a side flow type that the process gas is forced to flow along the side surface of the wafer. However, the present inventor believes that it is advantageous to supply the gas from a direction that faces the wafer in ALD as well.

Among the gas supply devices, there is a type called a gas shower head. In the lowest part of the gas shower head, a gas supply plate, called a shower plate formed with a plurality of gas supply holes, is formed. And, the gas shower head includes a gas input port and a gas flow path for linking the gas input port to the corresponding gas supply hole, and a diffusion space is formed in the gas flow path for diffusing the gas in a horizontal direction.

When converting the process gas in ALD, a purge gas is supplied before the supply of the next process gas begins. Thus, the process gas remained in the processing atmosphere is eliminated completely. The purge process is an important process that prevents the occurrence of the particles. In case there is insufficient purge process, for example, when two kinds of the process gases are passed and flowed through a common gas flow path or diffusion space, the process gases remained in the process atmosphere or in the gas supply device and newly supplied process gas react each other so that the reaction product is adhered to the wall. This is a reason that the particles are generated. Also, when each process gas is supplied by passing through each of the flow path in the gas shower head, because of the inverse-diffusion toward the inside of the gas supply hole, the process gas of one side penetrates into the flow path of the other side and reacts with the process gas of the other side where the purge process is not completed thereby adhering the reaction product. Meanwhile, the purge process is a subsidiary process that does not directly contribute to the film forming. On this account, it is desirable that the duration time of the purge process is as short as possible to improve the yield and the process gas can be completely flush out in this short time of the purge process.

In this point, the gas shower head needs comparatively large diffusion space to supply the process gas regularly to each of a plurality of the gas supply hole formed on the front surface of the shower plate, therefore the process needs time for substituting the inside of the diffusion space with the purge gas. Also, the gas tends to be filled in the corner of the diffusion space during the purge process. These are obstacles in eliminating the process gas completely.

Also, from the manufacturing point of view of the gas supply device, for example, a precise process is necessary because the gas shower head requires a plurality of fine hoes in the plurality of plates, and the plates are stacked together to form the gas flow path. Thus, it is not an easy process to manufacture the gas shower head and the manufacturing cost is relatively high.

The present inventor considered the gas supply nozzle having the same appearance as the gas supply nozzle used in an etching apparatus disclosed in Japanese Patent Application Laid-Open No. 2007-243138 (specifically, Claim 1, [0003], FIG. 1), as the gas supply device in ALD.

For example, as illustrated in the film forming apparatus 100 of FIG. 22A, gas supply nozzle 41 is formed by projecting into a process space, and a plurality of gas supply holes are formed on the surface of the gas supply nozzle. Also, since gas supply nozzle 41 is very small and has a simple constitution, the purge process may be performed within a short time. Also, it is easier to manufacture the gas supply nozzle 41 than the gas shower head.

However, when gas supply nozzle 41 is projected from the ceiling of the processing chamber, even if the wafer W is positioned as close as possible to gas supply nozzle 41, at least the ceiling has to be apart from the wafer W with the height of gas supply nozzle 41. For this reason, there is a concern that the purge time may take too long because the volume of process atmosphere 10 becomes relatively large. Also, if the volume of process atmosphere 10 gets large, there is concern that the cost of the film forming process may be increased because the necessary amount of process gas becomes large to maintain process atmosphere 10 with a required concentration of the process gas.

Thus, as illustrated in FIG. 22B, the present inventor developed a film forming apparatus 101 in which the lower space of the loading board is separated from process atmosphere 10 and the process gas is exhausted to the side thereby reducing the space necessary for the purge process. However, the film forming apparatus has some problem in that the exhausted gas tend to hit the side wall of the processing chamber 2 and generate a vortex of air current prohibiting a complete exhaustion of the process gas from the processing chamber.

In Japanese Patent Application Laid Open No. 2005-507030 (specifically, [0020], [0021], FIG. 3), an ALD type film forming apparatus is described formed with a taper surface at the ceiling of the processing chamber. The taper surface is formed on this apparatus in order to supply the process gas uniformly in a substrate surface. Also, the process gas is supplied into the processing chamber through the gas flow path which is an opening formed at the peak portion of the processing chamber. However, the constitution of the apparatus is basically different from the constitution described above in which the gas supply nozzle is projected from the ceiling of the processing chamber.

SUMMARY

The present invention is invented by considering the above problem and to solve the problem efficiently. One of the goals of the present invention is to provide a gas supply device that is easy to manufacture and has a simple constitution. Also, another goal of the present invention is to provide a film forming apparatus and a film forming method that the substitution of a gas is satisfactory and capable of increasing the yield when the ALD process is applied.

According to the present invention, the gas supply device that is positioned to face the substrate and supplies the process gas to the substrate disposed on the loading board of the processing chamber for a processing, is characterized to include a top plate member having a concave portion formed in a shape that the end portion thereof extends toward the loading board to form a gas diffusion space at a position that faces the substrate on the loading board, and a gas supply nozzle projecting into the concave portion from the top of the concave portion and having a plurality of gas supply holes along the circumferential direction of the concave portion.

According to the present invention, the process gas is supplied using the gas supply nozzle having a small size and simple constitution so that it is easy to manufacture and the manufacturing cost can be reduced as compared to the gas shower head having a constitution stacked with a plurality of plates.

Also, the gas supply nozzle is projected into the concave portion from the top of the concave portion formed in a shape that the bottom portion thereof is widened toward the lower portion of the top plate member, and all or a portion of the nozzle is received in the concave portion, so that the gas diffusion space formed in between the loading board can be made smaller. As a result, for example, the supply amount and time can be reduced as compared to the gas shower type gas supply device. Moreover, the time for purge process can be reduced when the purge process is required thereby reducing the variable cost and improving the yield.

For example, the concave portion is formed as a taper plane of which the end portion is widened toward the loading board.

Also, desirably, the gas supply nozzle is formed at a front-end portion of the gas supply tube that penetrates through the top plate member, and the gas supply nozzle and the gas supply tube are common to a plurality of the process gas.

Also, desirably, the gas supply tube is detachable with respect to the top plate member.

Also, desirably, the gas supply hole is opened having at least a slope of ten degrees according to central axis of the concave portion.

Also, desirably, the number of the gas supply holes of the gas supply nozzle increases per unit area of the surface of the gas supply nozzle as the gas supply nozzle heads toward from the front-end portion to the rear-end portion.

Also, according to the film forming apparatus of the present invention, a plurality of gases are supplied to the substrate loaded on the loading board of the processing chamber, and these gases are reacted to form a film on the surface of the substrate. The film forming apparatus of the present invention is characterized by having the processing chamber equipped with a loading board to load the substrate and a gas supply device that has at least one of the characteristics described above.

The film forming apparatus may preferably include a controller outputting a control signal to each part of the apparatus to alternately perform a step of supplying a base material gas as a first process gas to be absorbed on the substrate and a step of supplying a reaction gas that reacts with the base material gas as a second process gas thereby forming a reaction product on the substrate. The controller also outputs a control signal for a purge process using a purge gas in between the two steps.

Also, desirably, the film forming apparatus is equipped with a vacuum exhaust that is connected to the gas diffusion space of the gas supply device and exhaust the atmosphere of the gas diffusion space to a side surface.

Also, desirably, an opening of the loading board side of the concave portion is formed in such a way that the projected surface of the opening covers more than 30% of the substrate area mounted on the loading board.

Also, the present invention is a film forming method for forming a thin film on the surface of a substrate by supplying a plurality of different process gases to the substrate mounted on a loading board in a processing chamber and reacting the process gases. The method comprises a mounting process of mounting the substrate on the loading board in the processing chamber, and a process gas supply process of supplying the process gas by using the gas supply device that includes one of the features as described above.

The process gas supply process includes a step of supplying a base material gas as a first process gas to be absorbed on the substrate and a step of supplying a reaction gas reacting with the base material gas as a second process gas. The process gas supply process performs the two steps alternately to form a reaction product on the substrate, and preferably performs a purge process in between the two steps using a purge gas.

Also, the film forming method further comprises a process of vacuum exhausting the atmosphere of the gas diffusion space of the gas supply device to the side surface.

DETAILED DESCRIPTION

Referring to FIGS. 1 through 6, a film forming apparatus 1 will be described hereinafter according to an embodiment of the present invention. Film forming apparatus 1 uses a raw material gas including a strontium Sr (hereinafter, called "Sr raw material gas") as a first process gas and uses a raw material gas including a titanium Ti (hereinafter, called "Ti raw material gas") as a second process gas. These process gases are reacted with an ozone gas performing function as oxidization gas as a third process gas thereby forming a high dielectric material of strontium titanate ($SrTiO_3$, hereinafter called "STO") on a substrate, for example, a wafer surface of 300 mm in diameter, by the ALD process.

Figure 1:
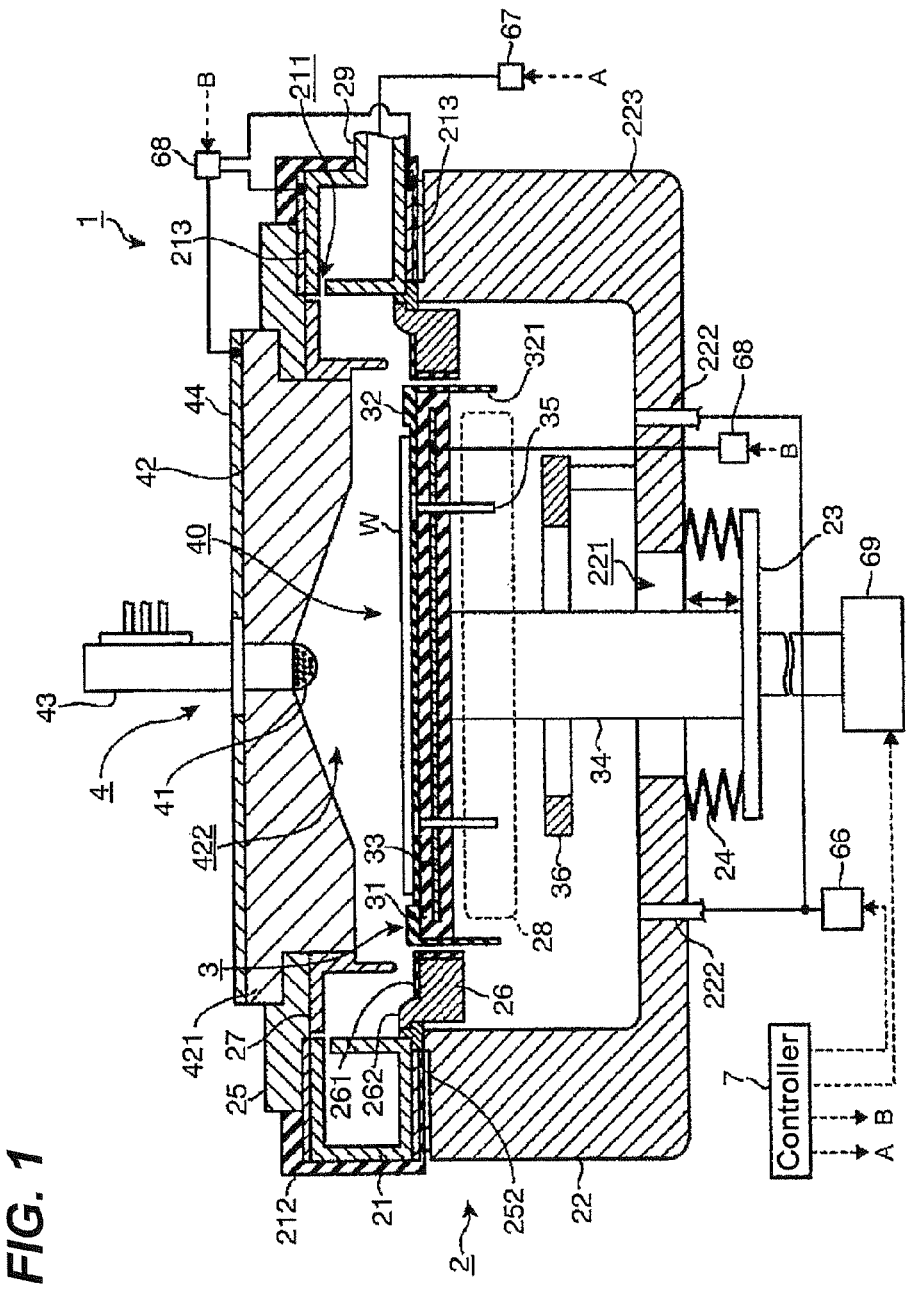
FIG. 1 is a cross-sectional view of a film forming apparatus according an embodiment of the present invention.

As illustrated in FIG. 1, film forming apparatus 1 includes a processing chamber 2 that forms a vacuum container, a loading board 3 provided in processing chamber 2 for mounting a substrate (wafer W), and a gas supply device 4 provided in the upper portion of processing chamber 2 to face with loading board 3 thereby providing the process gas to the surface of wafer W.

Loading board 3 includes a stage 31 which can be regarded as a main body of the loading board to support the wafer W, and a stage cover 32 configured to cover stage 31. Stage 31 is formed as a flat disk type made of material, for example, such as aluminum nitride or quartz. A stage heater 33 is provided inside stage 31 to heat the wafer W to a film forming temperature by heating the loading plane of loading board 3. Stage heater 33 is formed with, for example, a sheet-type resistive heating element and may heat the wafer W mounted on loading board 3 to 280° C. by supplying a power from power supply 68. Also, an electrostatic chuck (not shown) may be provided in state 31 to fix the wafer W mounted on loading board 3 by an electrostatic absorption.

Meanwhile, stage cover 32 constituting loading board 3 with stage 31 covers the upper surface and the side surface of stage 31 preventing the product or by-product from depositing on the surface of stage 31. For example, stage cover 32 is constituted as a detachable cover member of quartz (called "a coating shield") and a circle type concave portion having a diameter slightly larger than the wafer W is formed at the center area of the upper portion. The position of the wafer W can be determined on the loading board of stage cover 32 by the concave portion.

For example, loading board 3 is supported at the central part of the bottom surface of stage 31 by a column type support member 34. Support member 34 is constituted to be lifted by an elevator 69. As support member 34 is elevated, loading board 3 is constituted to be elevated at least by 80 mm between a transferred position in which the wafer W can be transferred in between the outside transfer apparatus, and a process position in which the wafer W may be processed.

Referring to FIG. 1, support member 34 passes through the bottom surface of processing chamber 2, the bottom surface of the lower-side chamber 22 specifically as will be described later, and is connected to elevator plate 23 which is elevated by elevator 69. Here, the gap between elevator plate 23 and lower-side chamber 22 is connected tightly by bellows 24.

Also, loading board 3 includes, for example, three elevator pins 35 for supporting the other side of wafer W and elevating wafer W with respect to the loading surface of loading board 3. For example, as shown in FIG. 1, these elevator pins 35 are attached by passing through stage 31 in the up/down direction so that the flat head section of each elevate pin is blocked at the top surface of stage 31 and the bottom portion is projected from the bottom surface of stage 31 when loading board 3 moves to the process position.

A ring type elevator member 36 is provided at the lower portion of each elevator pin 35 that passes through stage 31 in the up/down direction. Each elevator pin 35 may be elevated by elevating elevator member 36 when loading board 3 descends to the transfer position of wafer W. As a result, the wafer W of which the other side is supported by each elevator pin 35 can ascend from the loading surface of loading board 3.

Here, an opening (a concave portion having a large diameter) is provided at the upper surface portion of stage cover 32 where elevator pin 35 passes through in order to receive the head section of elevator pin 35. As a result, as illustrated in FIG. 1, when loading board 3 moves to the transfer position of wafer W, a flat loading surface can be formed at the top surface of loading board 3 because the upper surface of stage cover 32 and the head section of each elevator pin 35 make an identical surface. Also, the side wall portion of stage cover 32 extends until the lower portion of stage 31 and forms a skirt section 321 that surrounds the lower portion of stage 31.

The constitution of processing chamber 2 is described hereinafter. Processing chamber 2 is constituted by stacking the loop-type exhaust duct 21 on top of the bowl-type lower chamber 22. Lower chamber 22 may be constituted, for example, by aluminum, and is provided with a through hole 221 at the bottom surface. Also, support member 34 of stage 31 as described above passes through the bottom surface of lower chamber 22.

Also, a purge gas supply route 222 is provided near through hole 221 at, for example, four locations. Purge gases such as nitrogen gas supplied from purge gas supply source 66 may be supplied to lower chamber 22 via purge gas supply route 222.

In FIG. 1, a transfer unit 28 indicated as dotted-line is an opening for carrying in/out wafer W using an external transfer device. Transfer unit 28 is constituted to be opened/closed by a gate valve (not shown) provided at the side wall portion 223 of processing chamber 2.

For example, exhaust duct 21 is made of an aluminum material and is formed as a loop-shape object formed by a curved duct having a square cross section. Each of the inner and outer diameters of the loop-shape object is substantially similar to the inner and outer diameters of side wall portion 223 of lower chamber 22, respectively. Here, regarding exhaust duct 21, the wall side closer to diffusion space 40 may be called an inner wall surface, and the wall side further from diffusion space 40 may be called an outer wall side. At the upper portion of the inner wall surface, a plurality of slit-type vacuum exhaust devices 211 are formed in a circumferential direction with a gap extending along the horizontal direction (circumferential direction). An exhaust pipe 29 is connected to, for example, a position of the outer wall surface of exhaust duct 21. For example, using a vacuum pump 67 connected to exhaust pipe 29, a vacuum exhaustion can be achieved through each vacuum exhaust devices 211. Moreover, as illustrated in FIG. 1, an insulation member 212 is provided in exhaust duct 21 covering the outer circumferential section from the upper surface portion along with the outer wall surface and the lower surface side.

Exhaust duct 21 is overlapped with lower chamber 22 via insulation member 212, and processing chamber 2 is formed by these elements being insulated and integrated. And, a plurality of vacuum exhaust device 211 formed at the inner wall surface of exhaust duct 21 are opened toward the processing atmosphere that includes diffusion space 40 formed in between gas supply device 4 and loading board 3. Accordingly, the processing atmosphere can be vacuum exhausted through vacuum exhaust device 211. The space that guides the processing atmosphere to vacuum pump 67 corresponds to the vacuum exhaust path of film forming apparatus 1.

Also, as illustrated in FIG. 1, an inner block 26 is provided inside processing chamber 2 in order to divide the lower space of lower processing chamber 2 that includes the processing atmosphere from the upper space which is higher portion than loading board 3. Inner block 26 is a ring-type member made of, for example, aluminum, and formed with a size that can be fit into the gap between the inner wall surface of side wall portion 223 of lower chamber 22 and the circumferential side of skirt section 321.

A bump edge 262 is further formed at the outer circumferential portion of the upper surface of inner block 26 widening toward outside. Inner block 26 is fixed inside processing chamber 2 with a shape of projected ring from the inner wall surface of lower processing chamber 22 when bump edge 262 is latched into a central ring 252 inserted in between side wall portion 223 of lower processing chamber 22 and the lower end portion of inner wall surface side of exhaust duct 21.

As illustrated in FIG. 1, a block cover 261 made of quartz covers the area extending from the upper surface of inner block 26 to the inner circumferential surface thereby suppressing the accumulation of the reaction product on the surface. Specifically, when loading board 3 is in the processing position, block cover 261 may surround the side surface of stage cover 32 (the side surface of skirt section 321) through, for example, of 2 mm gap. As a result, a situation is formed where it is difficult for the gas of the processing atmosphere to be diffused in the lower space.

A buffle ring 27 which is ring member of having its cross section a reverse L-shape is provided in the ring-shaped space between the inner wall surface of exhaust duct 21 and ceiling board member 42 which will be described later, in order to improve the uniformity of the vacuum exhaustion from the space at the circumferential direction by reducing the through-flow conductance of the space.

The constitution of gas supply device 4 is described hereinafter. Referring to FIG. 1, gas supply device 4 includes ceiling board member 42 configured to form diffusion space 40 of the gas in between loading board 3, and gas supply nozzle 41 configured to supply the processing gas and/or purge gas toward diffusion space 40.

Figure 2:
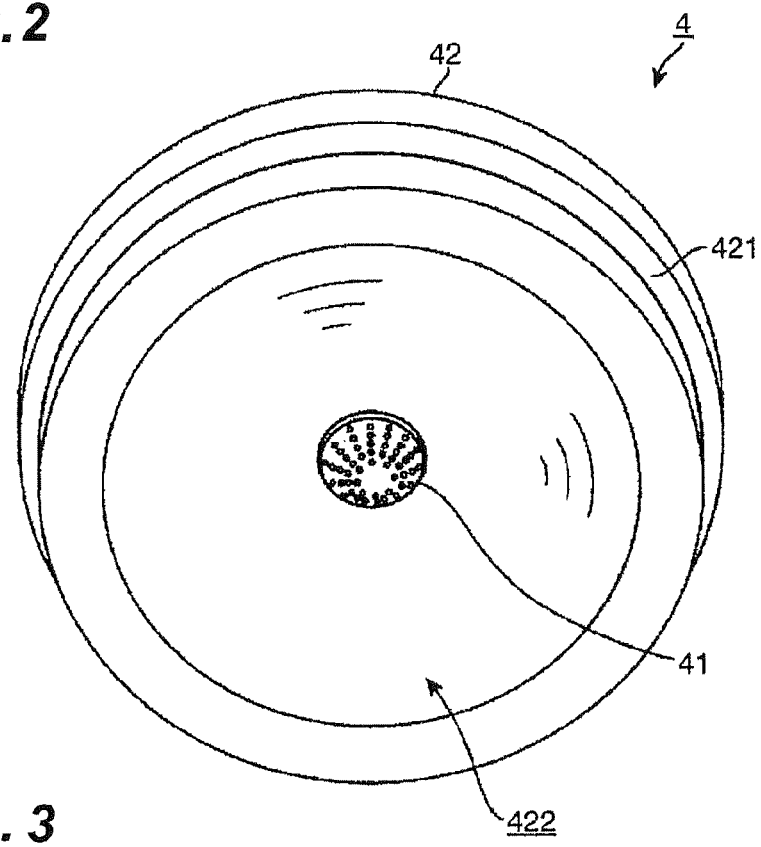
FIG. 2 is a perspective view of a gas supply device formed in the film forming apparatus viewed from the bottom side.

Referring to FIG. 2, ceiling board member 42 is a substantially circular member made, for example, of aluminum, and forms a tight vacuum chamber by closing the opening of the upper surface of processing chamber 2. Referring to FIGS. 1 and 2, a flange section 421 is provided at the circumferential of the upper portion of ceiling board member 42. Flange section 421 is stacked and fixed to the upper surface side of exhaust duct 21 through the ring type support member 25 having a level difference coupled to flange section 421. The circumferential side of ceiling board member 42 is tightly combined with support member 25 and the inner circumferential surface of buffle ring 27. Also, flange section 421 is detachably connected to support member 25 by, for example, a bolt (not shown).

Figure 4:
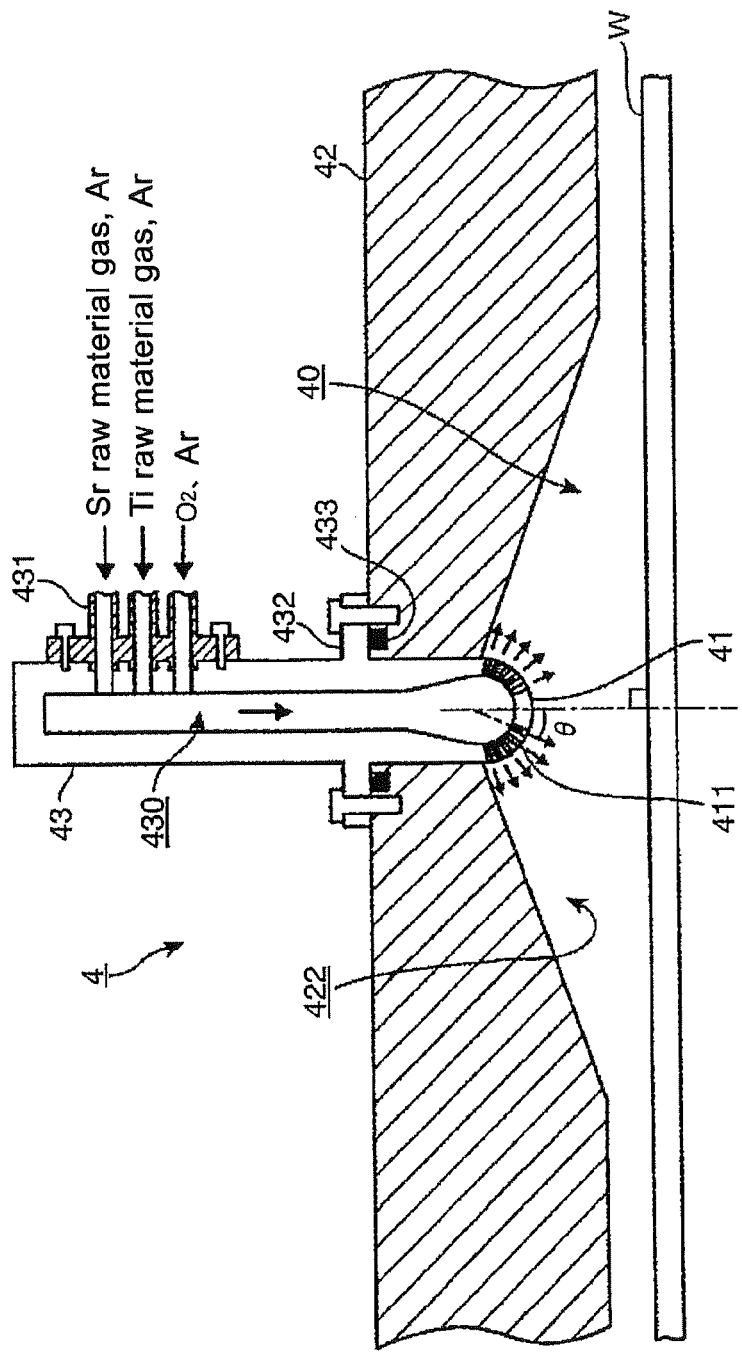
FIG. 4 is a cross-sectional view of the gas supply device of FIG. 2.

As shown in FIGS. 1 and 4, at the central part of the lower side of ceiling board member 42, a concave portion 422 is formed with a shape that the end portion is widening toward loading board 3 side. As illustrated in FIG. 2, concave portion 422 is opened as a concentric circle shape along with the bottom surface of ceiling board member 42, and the opening is positioned to be facing with wafer W mounted on loading board 3 thereby covering wafer W by equal to or more than 30% of wafer W, for example, 72% of the wafer W area. According to the present embodiment, the diameter of the opening is, for example, 255 mm. The space formed between concave portion 422 and loading board 3 is diffusion space 40 configured to diffuse various gases supplied to processing chamber 2 toward the surface of wafer W.

Figure 3:
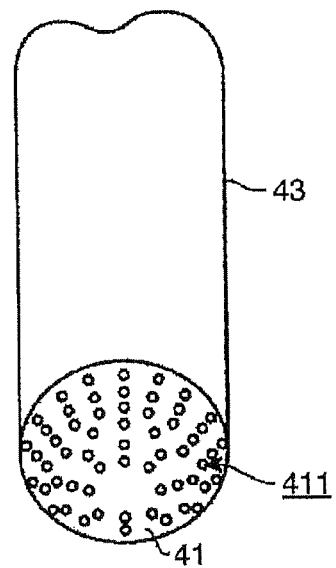
FIG. 3 is an expanded-perspective view illustrating the gas supply nozzle as shown in FIG. 2.

From the peak of concave portion 422, a hemisphere type gas supply nozzle 41 is projected from inside concave portion 422 toward loading board 3. Gas supply nozzle 41 is provided with a plurality of gas supply holes 411. As illustrated in FIGS. 1, 3, 4, gas supply nozzle 41 is attached at the front-end side of gas supply tube 43. Gas supply tube 43 passes through the central portion of ceiling board member 42, and because of this, gas supply nozzle 41 is projected inside concave portion 422. Also, flange section 432 is provided at the lower circumferential side of gas supply tube 43. While flange section 432 is fixed to the upper surface of ceiling board member 42 by a bolt etc, gas supply tube 43 is detachable with respect to ceiling board member 42.

As illustrated in FIG. 4, the inside of gas supply nozzle 41 and gas supply tube 43 is a cavity. The cavity section plays a role of gas through-flow space. Also, a manifold 431 is fixed to the side of the rear-end portion of gas supply tube 43. Due to these set ups, various gases are provided to diffusion space 40 via a path of manifold 431→through-flow space 430→gas supply hole 411. Specifically, manifold 431 supplies three kinds of process gases of Sr raw material gas, Ti raw material gas and ozone gas, further more, supplies, for example, argon gas (Ar) working as a carrier gas of the various process gas as well as being used as a purge gas.

A plurality of gas supply holes 411 formed on gas supply nozzle 41 are aligned and opened along with the circumferential direction of concave portion 422 that surrounds gas supply nozzle 41 on the linear line extended to the diameter direction from the central position of hemisphere type gas supply nozzle 41.

Here, the ALD is a process that forms a uniform film in which one layer or few atomic layers or molecular layers are absorbed to the surface of wafer W, and reacted each other to form a film. The thin film is then stacked by repeating the absorbing and reacting processes to form a uniform film. Accordingly, when the strength of the gas flow is too strong at the time the source gas reaches the surface of wafer W, there is a problem that the gas is absorbed with more than predetermined amount and the film is too thick at the area. Accordingly, in gas supply nozzle 41 of the present embodiment, gas supply holes 411 are not formed at the front-end portion, but formed only at the outer side area of the front-end side. As a result, the angle θ between gas supply holes 411 and the central shaft of gas supply nozzle 41 is at least 10° or more, for example 25° or more. As a result, the strength of the gas flow is weakened by the time the source gas reaches the surface of wafer W. A more detailed description regarding the action effect will be followed.

Figure 5:
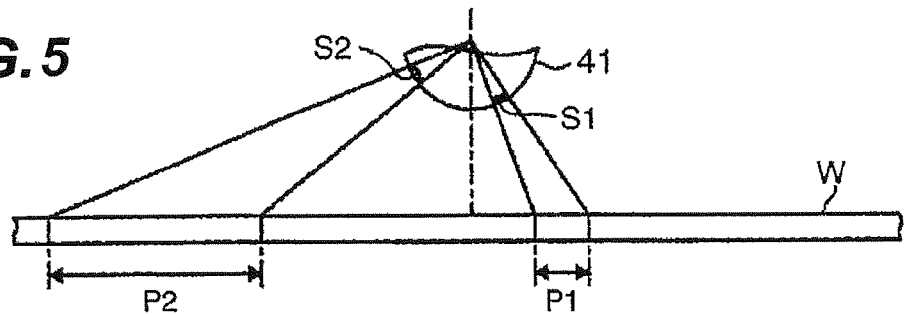
FIG. 5 is an expanded-side view illustrating a state where the gas supply nozzle of FIG. 2 is positioned to face a wafer.

Also, as shown in FIG. 3, in gas supply nozzle 41, gas supply holes 411 are provided in such a way that the number of openings per unit area is smaller at the front-end area of gas supply nozzle 41, and getting bigger toward the rear-end area. The reason is as follows, as illustrated in FIG. 5. When a circular area S1 of the front-end side of gas supply nozzle 41 and a circular area S2 of the rear-end side of gas supply nozzle 41 having the same area as S1 are projected toward the surface of wafer W, the projected surfaces P1 and P2 are formed. When the two projected surfaces P1 and P2 are compared, the projected surface P2 of the circular area S2 of the rear-end side is bigger than the projected surface P1 of the circular area S1 of the front-end side. That is, when the opening area of each of gas supply holes 411 is the same at the front-end side and rear-end side, the number of gas supply holes 411 arranged inside each area S1, S2 may be adjusted so that the number of openings of gas supply holes 411 per unit area can be consistent inside the projected area in each of the projected surfaces P1, P2. Alternatively, when the opening area of gas supply holes 411 is different each other at the front-end side and the rear-end side, the ratio between the opening area of the front-end side and the rear-end side may be P1:P2. Eventually, the opening area of gas supply holes 411 may be given to the front-end side and the rear-end side proportional to the projected area P1:P2. As a result, the gas concentration can be maintained uniformly when the gas reaches the surface of wafer W.

Figure 6:
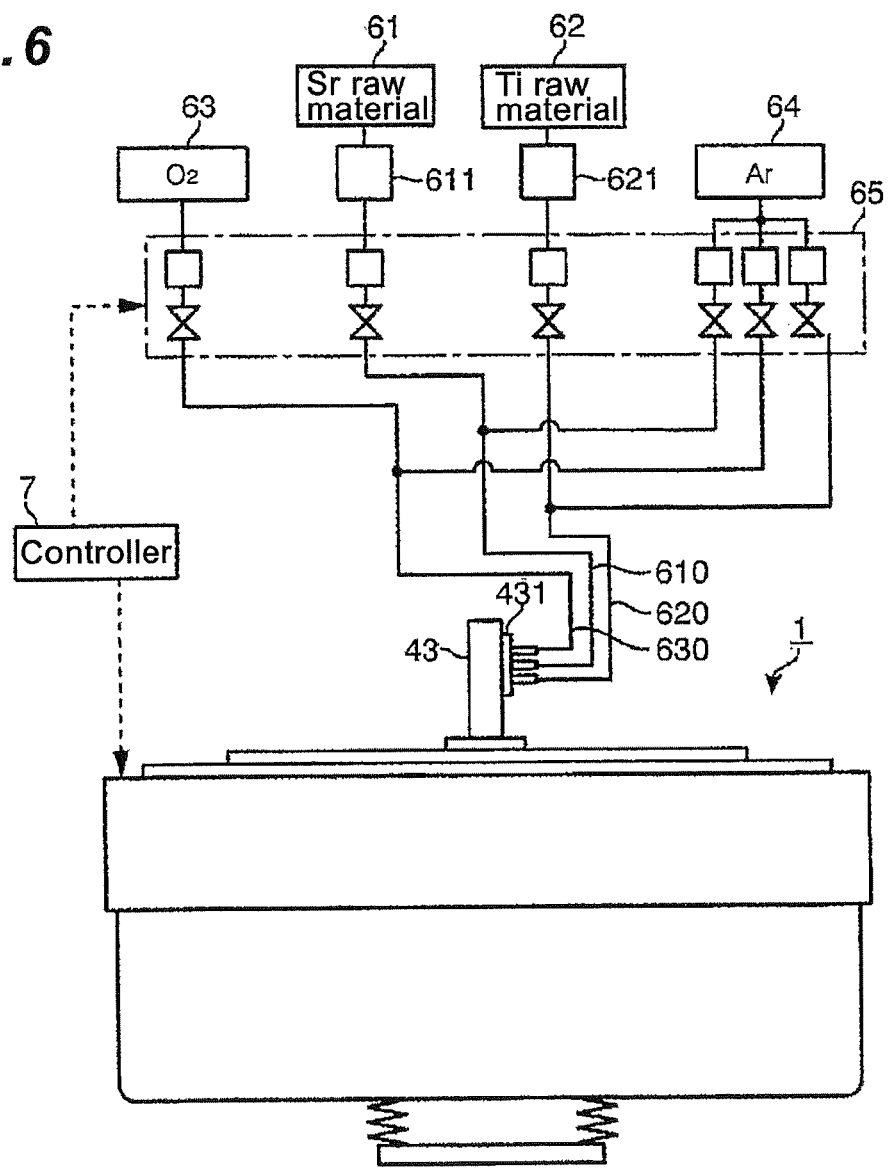
FIG. 6 is a gas supply route of the film forming apparatus.

As shown in FIG. 6, manifold 431 is connected to gas supply lines 610, 620, 630 for supplying various gases. Each of gas supply lines 610, 620, 630 is connected to various gas sources 61, 62, 63, 64 at the upstream side.

Specifically, Sr raw material gas supply line 610 is connected with Sr raw material supply source 61. At supply source 61, liquid Sr raw material, such as strontium bis tetramethyl heptanedionate $Sr(THD)_2$ or bis pentamethyl cyclopenta dienyl strontium $Sr(Me_5Cp)_2$, are stored. The Sr raw material is pressed out to the supply line and evaporated by an evaporator 611 to become Sr raw material gas. The Sr raw material gas is then supplied to manifold 431 through gas supply line 610.

Also, Ti raw material gas line 620 is connected to Ti raw material supply source 62. In supply source 62, liquid Ti raw material, such as titanium bis-isopropoxide bistetra methyl heptanedionato $Ti(OiPr)_2(THD)_2$ or titanium tetra isopropoxide $Ti(OiPr)$, is stored. Like Sr raw material, Ti raw material gas is evaporated by evaporator 621 and supplied to manifold 431 through gas supple line 620.

Also, ozone gas supply line 630 is connected to ozone gas supply source 63 formed with a well-known ozonizer.

Each of Sr raw material supply line 610, Ti raw material supply line 620 and ozone gas supply line 630 is divided on the way of the path and then connected to a purge gas supply source 64 constituted by argon gas cylinder etc. Therefore, argon gas may be supplied to each of gas supply lines 610, 620, 630 as either a carrier gas of each of raw material gas or a purge gas of each of process gas.

In between gas supply lines 610, 620, 630 and gas supply sources 61, 62, 63, 64, a flow rate control apparatus group 65 including valves and flowmeters, etc. is provided. For this reason, according to the requesting order from controller 7 which will be described later, the supply timing and supply amount of various gases are controlled.

Returning to the description of the constitution of film forming apparatus 1, a heater 44, 213 is provided at the upper surface of ceiling board member 42, and the lower surface side and upper surface side of the outer wall surface of exhaust duct 21, as illustrated in FIG. 1. Heater 44, 213 may be formed with a sheet-type resistance heating element. The heater is configured to heat ceiling board member 42 and the entire area of exhaust duct 21 by the power supplied from power supply 68, and prevent the adhesion of the reaction product at the lower surface of gas supply nozzle 41 and the inner surface of exhaust duct 21. Heater 44, 213 is omitted in the figures except for FIG. 1 for the brevity of the disclosure. In addition to heaters 44, 213 described above, another heater may be provided, for example, in the inner block 26 to prevent the adhesion of the reaction product but omitted from the figures for the sake of description.

Film forming apparatus 1 includes controller 7 that controls the gas supply operation from gas supply sources 61, 62, 63, 64 described above, ascending operation of loading board 3, exhaust operation in processing chamber 2 by vacuum pump 67, and heating operation by stage heater 33 and each of heaters 44, 213. For example, controller 7 is constituted by a computer including a CPU and a memory (not shown). Memory stores a program that is combined step (order) groups about a control for performing film forming process to wafer W by film forming apparatus 1, a control for adjusting the supply suspend timing or supply amount of various gas supply from gas supply source 61, 62, 63, 64, a control for adjusting vacuum rate of inside of processing chamber 2, a control of ascending movement of loading board 3, and a control of temperature of each of heaters 33, 44, 213. The program may be stored in storage medium such as hard disk, compact disk, magnet optical disk, memory card, etc., and may be installed from the storage medium to the storage part.

Hereinafter, the operation of film forming apparatus 1 provided with gas supply device 4 described above.

Figure 7:
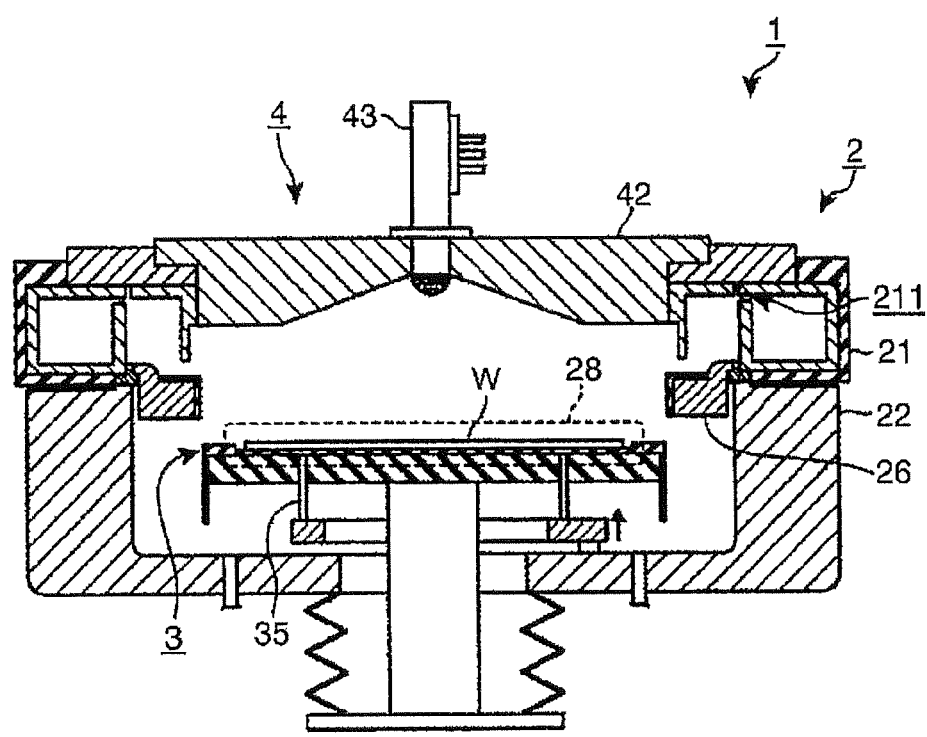
FIG. 7 is a first actional view of the film forming apparatus.

First, as shown in FIG. 7, once transfer unit 28 is opened, an external transfer device is introduced via transfer unit 28 and wafer W is carried in to processing chamber 2. Subsequently, via elevator pin 35, wafer W is loaded on loading board 3 positioned at the transfer position. By the electrostatic chuck (not shown), wafer W is statically fixed on loading board 3. At this time, exhaust duct 21 and the surface of inner block 26 may be heated to, for example 230° C. by heater 213. Also, the surface of ceiling board member 42 inside processing chamber 2 may be heated to, for example, 250° C. by heater 44. Next, transfer unit 28 is closed, and after the inside of processing chamber 2 is become air tight, processing chamber 2 is become a vacuum state by vacuum pump 67 and through exhaust duct 21.

At this time, as described above, inner block 26 is fixed at a higher position than the position where transfer unit 28 is provided. Thus, as shown in FIG. 7, when loading board 3 is descended to the wafer transfer position, the space inside lower chamber 22 is communicated (not divided) with the processing space. Therefore, an entire processing chamber 2 including lower chamber 22 is vacuum exhausted during the vacuum exhaust process.

Figure 8A:
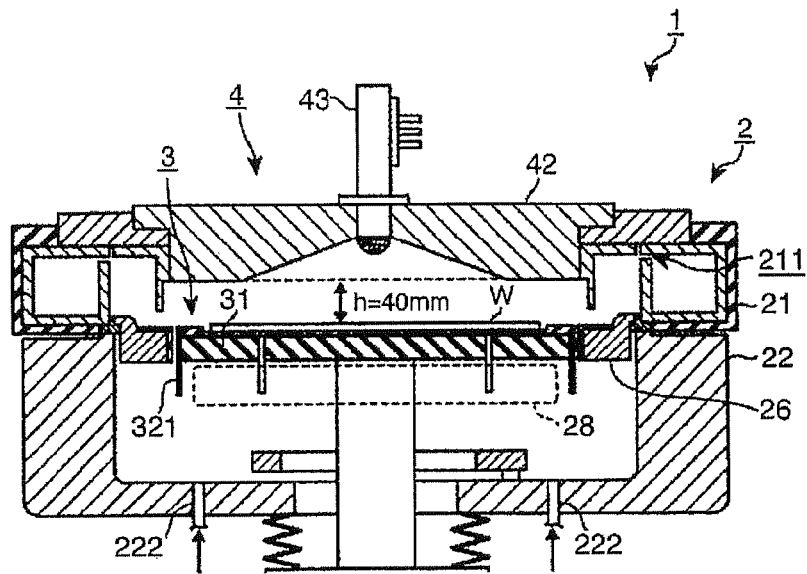
FIGS. 8A and 8B are second actional views of the film forming apparatus.
Figure 8B:
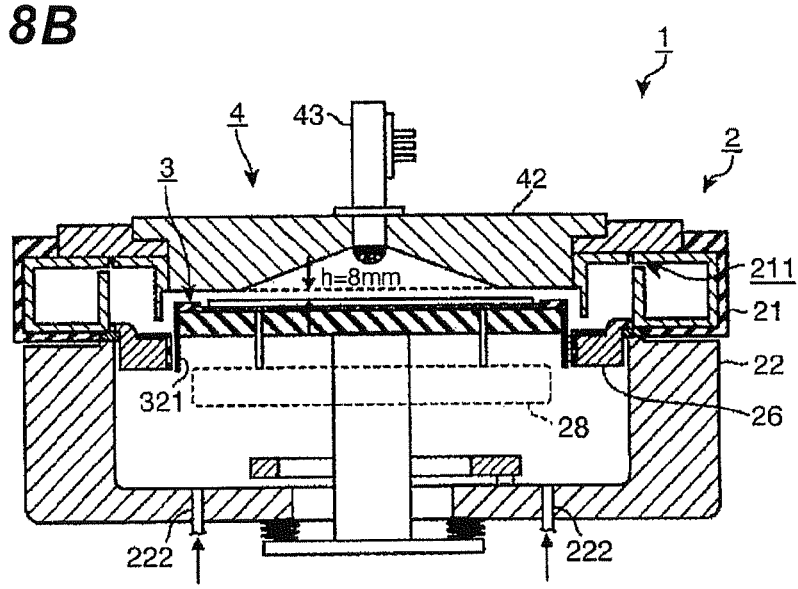

When the inside of processing chamber 2 is vacuum exhausted to a predetermined pressure, loading board 3 loaded with wafer W is ascended to the processing position selected according to the recipe that defines the processing condition of wafer W. According to film forming apparatus 1 of the present embodiment, with regarding to the processing position, the distance h (hereinafter "gap") between the surface of wafer W and the lower surface of ceiling board member 42 can be changed. Specifically, the distance can be changed in an up/down direction from the processing position where h=40 mm as illustrated in FIG. 8A, to the processing position where h=8 mm as illustrated in FIG. 8B. When loading board 3 is ascended to a predetermined position, the circumferential side of stage cover 32 or skirt section 321 extended from the circumferential side are surrounded by inner block 26, and the upper space of loading board 3 and the lower space of lower processing chamber 22 are divided by loading board 3 and inner block 26.

When the upper space and the lower space are divided, the introduction of purge gas begins from purge gas supply route 222 to lower chamber 22. And, the temperature of wafer W is heated to, for example, 280° C. by stage heater 33. And then, the film forming process of STO begins. In each of FIG. 7, FIGS. 8A and 8B, stage heater 33 is not illustrated for convenience. Also, hereinafter, the description will be made by assuming the process position of wafer W as the position indicated in FIG. 8B.

Figure 9:
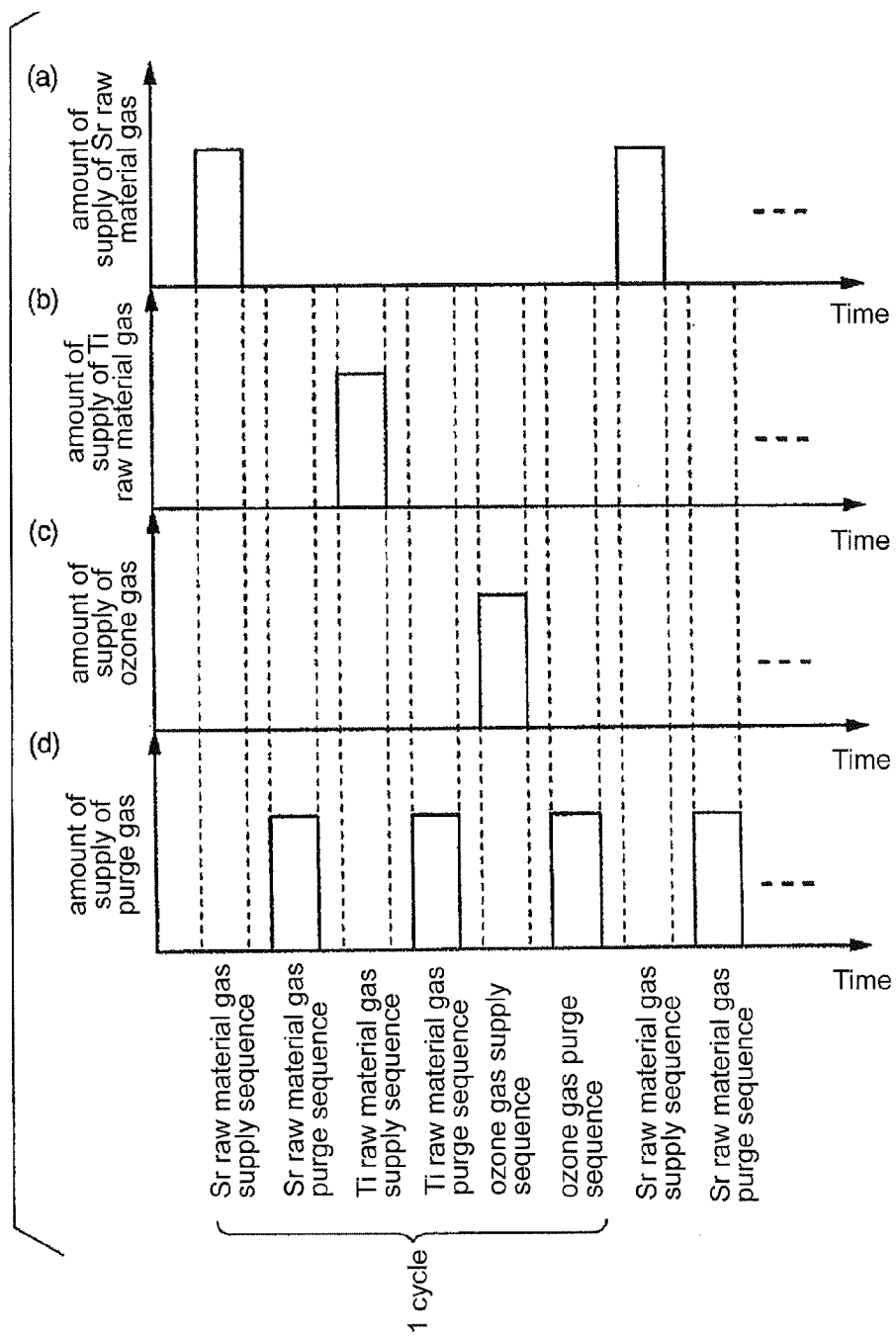
FIGS. 9(*a*), 9(*b*), 9(*c*), 9(*d*) are gas supply sequence flow of a film forming process by the film forming apparatus.

The STO film forming process by the ALD process is performed based on the gas supply sequence shown in FIG. 9. White color columns shown in FIGS. 9 (a)~(d) represent the amount of the supply of various gases (Sr raw material gas, Ti raw material gas, ozone gas, purge gas) supplied from each of gas supply sources 61, 62, 63, 64.

Figure 10:
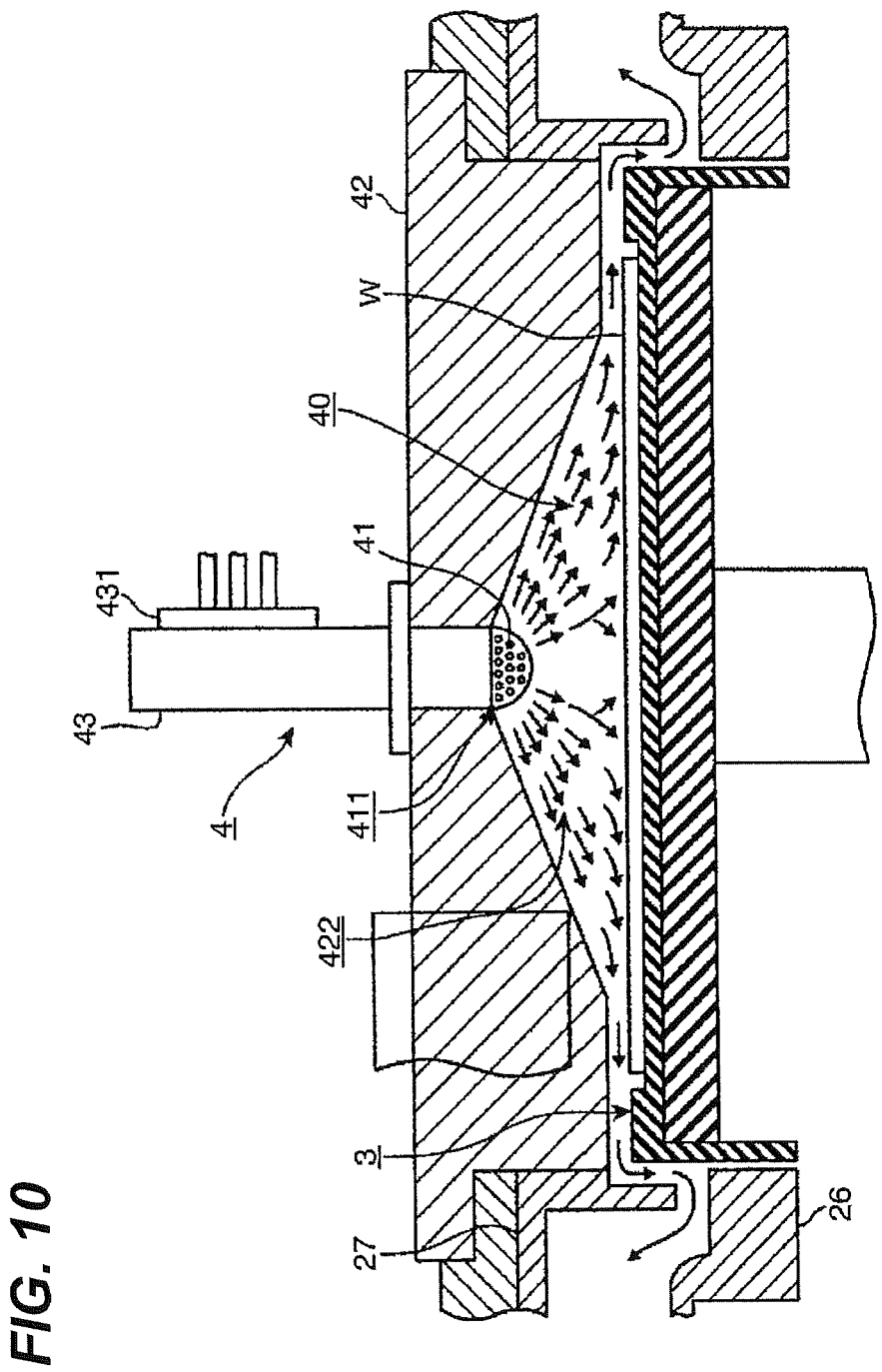
FIG. 10 is a third actional view of the film forming apparatus.

FIG. 10 schematically illustrates the gas flow in processing chamber 2 during performing the sequence.

As shown in FIG. 9(a), according to the gas supply sequence, Sr raw material gas is supplied first (Sr raw material gas supply process). At this time, the Sr raw material gas passes a through-flow space 430 and arrives at gas supply nozzle 41. The Sr raw material gas then supplied to diffusion space 40 after passing through gas supply holes 411. As shown in FIG. 10, the Sr raw material gas getting out of gas supply holes 411 spreads to diffusion space 40 as a radical shape and then flows to wafer W on loading board 3.

At this time, as shown in FIG. 1, vacuum exhaust device 211 provided in exhaust duct 21 surrounds diffusion space 40 in processing chamber 2. Therefore, the raw material gas that arrived at wafer W flows through the diameter of wafer W toward vacuum exhaust device 211. As a result, the circumferential area of wafer W that does not face the opening of concave portion 422 can absorb the raw material gas as well when the gas flows toward vacuum exhaust device 211. That is, not only the wafer area that faces concave portion 422, but also the circumferential area of wafer W can be regarded as diffusion space 40 of wafer W. As described above, since the raw material gas flows through the diameter direction of wafer W, the moving distance of the raw material gas becomes short as compared to the side flow type, and the molecules of each of the raw material gases can be absorbed uniformly along the diameter direction of wafer W.

In gas supply device 4 according to present embodiment, gas supply nozzle 41 is accommodated in concave portion 422. For this reason, the volume of diffusion space 40 (the space that faces concave portion 422 and the upper space of the circumferential area of wafer W) is reduced. As a result, the raw material gas can be uniformly absorbed over the entire surface of wafer W with less amount, and the time for supplying the raw material gas is reduced as well.

Meanwhile, when the opening area of concave portion 422 is excessively small, the circumferential area of wafer W not corresponding to the opening area becomes large. That is, the area ratio in which the gas is absorbed on the surface of wafer W becomes large in the narrow flow path formed in between wafer W and the horizontal portion of ceiling board member 42. When the area ratio becomes large, the necessary time to supply the gas to the entire surface of wafer W becomes large, and the gas flow can be biased. As a result, the concentration of the gas supplied to the circumferential area can be imbalanced.

To cope with these concerns, in processing chamber 2 of the present embodiment, the opening of concave portion 422 is configured to cover 30% or more, for example, about 70% of area of wafer W. For this reason, the gas is directly supplied from concave portion 422 to almost every area of wafer W, and it can be guaranteed that the gas can be uniformly supplied within a short time. The opening of concave portion 422 can be configured to cover the entire wafer W. However, there is disadvantage as well because the volume of diffusion space 40 increases as the opening area becomes large. That is, the amount of gas to be supplied and the gas supply time may be increased. The size and shape of the opening of concave portion 422 need to be determined by considering the balance with the disadvantages.

As described above, gas supply holes 411 of gas supply nozzle 41 are formed at an area excluding the front-end portion (outside area to the front-end portion). Also, as illustrated in FIG. 4, the angle θ between gas supply holes 411 and the central shaft of gas supply nozzle 41 (the central shaft of concave portion 422) is 10° or more, for example, 25° or more. Due to the structure, the movement of the raw material gas flowed from flow-through space 430 is blocked and changed at the front-end of gas supply nozzle 41. At this time, the loss of pressure becomes large and the pressure inside gas supply nozzle is increased. As a result, the strength of the raw material gas becomes weaken from gas supply holes 411 of the front-end side to wafer W, and the strength of the raw material gas becomes powerful from gas supply holes 411 of the rear-end side to wafer W. For this reason, the gas can be spurt out uniformly from all of gas supply holes 411 of gas supply nozzle 41. Moreover, since gas supply holes 411 are opened with an angle θ (slope), the distance from gas supply holes 411 according to the spurt direction to wafer W become longer. This fact also contributes to the weakening of the gas strength at the surface of wafer W. By these effects, an excessive absorption or attachment of the raw material gas on the surface of wafer W can be suppressed, and specifically, the problem that the thickness of the film at the right below area of gas supply nozzle 41 becomes thicker can be suppressed.

Although gas supply holes 411 are not provided at the front-end of gas supply nozzle 41, the raw material gas is supplied to the surface of wafer W right underneath of the front-end side from surroundings due to the diffusion of the raw material gas (specially, the change of the flow direction when the raw material gas reaches at the surface of wafer W). As a result, it has been confirmed that there is no problem in the film forming.

Moreover, as described above with FIGS. 3 and 5, in gas supply nozzle 41 of the present embodiment, the number of the openings of gas supply holes 411 is becoming small toward the front-end area and becoming large toward the rear-end area. For this reason, the alignment number of gas supply holes 411 per unit area can become uniform in the projected surface according to the gas supply direction from gas supply nozzle 41 to wafer W. As schematically illustrated in FIG. 10, the number of gas flow lines per unit area supplied to the surface of wafer W becomes almost identical. Therefore, the concentration of the raw material gas supplied to wafer W can be further uniformed.

After a predetermined time is elapsed and the an absorption layer of the Sr raw material gas is formed on wafer W, the supply of the Sr raw material gas is stopped, and, as illustrated in FIG. 9(d), the purge gas is supplied from purge gas supply source 64. As a result, the Sr raw material gas residing at the processing atmosphere, gas supply nozzle 41 and gas supply tube 43 is purged out (a purge process of Sr raw material gas). Once the purge gas is introduced to gas supply tube 43, it passes similar paths to the Sr raw material gas and flows toward vacuum exhaust device 211. At this time, since the volume of diffusion space 40 is relatively small and the size of gas supply nozzle 41 and gas supply tube 43 is small as compared to the gas shower head, the residue amount of purged Sr raw material gas is small. That is, the gas consumption of the expensive raw material gas can be reduced and the purge process can be taking place within a short time.

Once the purge process for the Sr raw material gas is completed, Ti raw material gas is supplied, as illustrated in FIG. 9(b) (the supply process of the Ti raw material gas). Ti raw material gas is introduced to diffusion space 40 following the common path to Sr raw material gas and the purge gas. The raw material gas is absorbed uniformly on the surface of wafer W while the raw material gas flows from the area that faces the opening of concave portion 422 to the circumferential area.

After a predetermined time is elapsed and an absorption layer of the Ti raw material gas is formed on wafer W, the supply of the Ti raw material gas is stopped and the residual Ti raw material gas is purged according the similar order for the purge gas of the Sr raw material gas as shown in FIG. 9(d) (a purge process for the Ti raw material gas).

Subsequently, ozone gas is supplied through the common paths to each raw material gas and purge gas as shown in FIG. 9(c) (the supply process of ozone gas). The ozone that arrives at the surface of wafer W reacts with the raw material gas absorbed on the surface of wafer W by the thermal energy from stage cover 32 to form molecular layers of the STO.

After the ozone gas is supplied for a predetermined of time, the supply of the ozone gas is stopped, and the ozone gas is purged out following the similar sequences of each purge process described above as shown in FIG. 9(d) (the purge process of ozone gas).

Although not mentioned in the description of each process, like in the supply process of the Sr raw material gas, small amount of the Ti raw material gas and the ozone gas are supplied to the surface of wafer W uniformly within a short time period. Also, since the residual gas of the process gas to be purged in each process is small, the purge process can be completed within a short time period.

As illustrated in FIG. 9, by combining the six processes as one cycle and repeating the cycle for a predetermined number of times, for example, 100 times, a plurality of molecular layers of the STO are formed, thereby forming the STO film with a predetermined thickness. Once the desired film forming is completed, the supply of each process gas is stopped, loading board 3 loaded with wafer W is descended to transfer unit 28, and the pressure of processing chamber 2 is returned to the state prior to the vacuum exhaustion. Subsequently, wafer W is carried out by the external transfer device following a reverse path to when wafer W is carried in, thereby completing a series of film forming operations.

The following effects can be obtained according to gas supply apparatus 4 of the present embodiment. That is, gas supply apparatus 4 is a small size and uses gas supply nozzle 41 having a simple structure so that the fabrication is easy compared to the shower head having a structure of stacking a plurality of plate and the manufacturing cost of gas supply apparatus 4 and film forming apparatus 1 can be reduced.

Also, the volume of diffusion space 40 formed between loading board 3 can be made smaller because gas supply nozzle 41 is projected and provided from the peak position of concave portion 422 formed with a shape in which the end side is widening from the lower portion of ceiling board member 42, for example, the entire portion of nozzle 41 is received inside concave portion 422. As a result, for example, the amount of processing gas and supply time are reduced as compared to the shower head type gas supply apparatus. Moreover, since the time required for the purge process can also be reduced, the variable cost can be reduced and the yield can be improved.

Figure 11A:
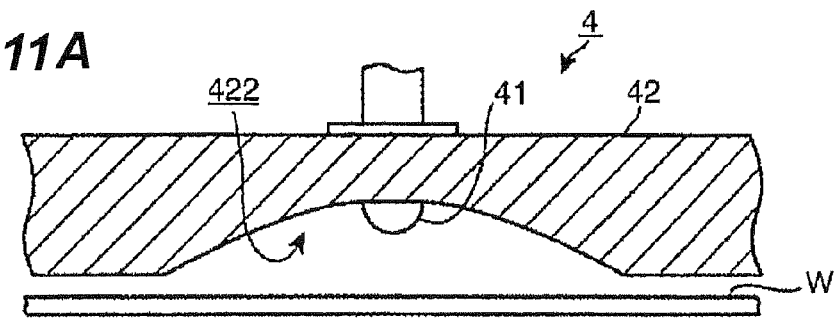
FIGS. 11A, 11B, 11C, 11D are modified examples of the gas supply device.
Figure 11B:
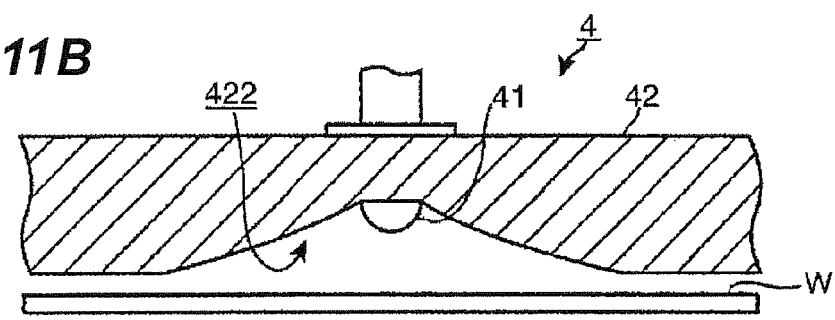
Figure 11C:
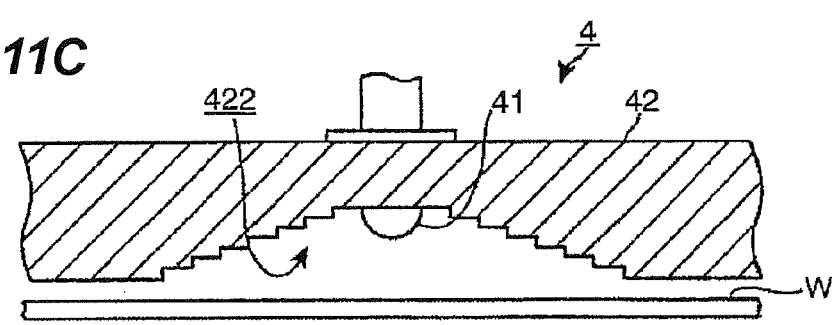

Here, the shape of concave portion 422 provided in gas supply apparatus 4 is not limited to the taper surface shape of the above described embodiments. For example, as illustrated in FIG. 11A, 11B, the shape of the cross section of concave portion 422 may be defined as a curved line. Also, as illustrated in FIG. 11C, the shape of the cross section of concave portion 422 may be a stair-like shape.

Figure 11D:
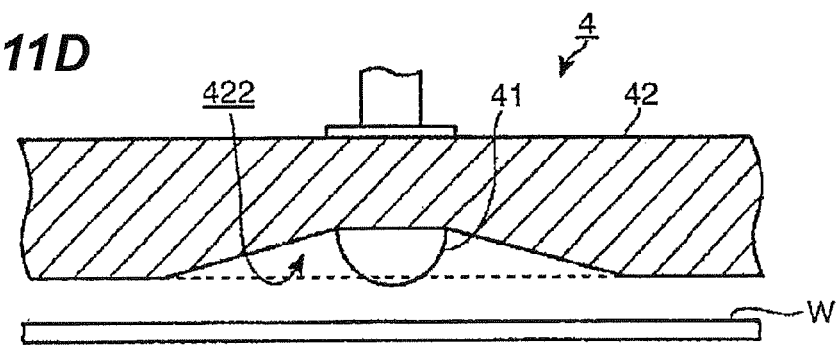
Figure 22A:
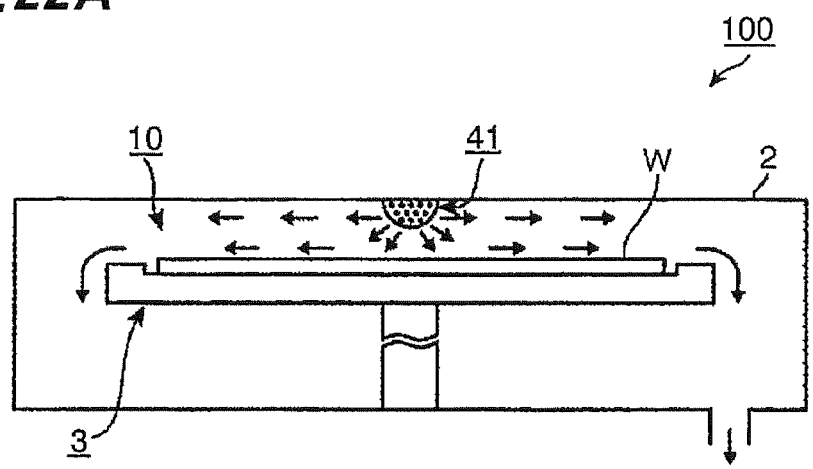
FIGS. 22A, 22B are descriptive views of a film forming apparatus having a gas supply nozzle as reference examples.
Figure 22B:
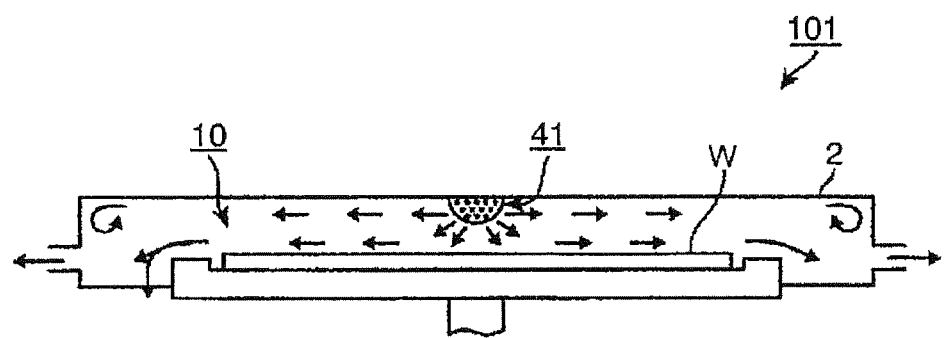

Referring to FIG. 11D, the entire gas supply nozzle 41 may not be received inside concave portion 422, but, for example, the front-end side of gas supply nozzle 41 may be projected from concave portion 422. When a portion of gas supply nozzle 41 is received inside concave portion 422, the volume of processing atmosphere can be reduced as compared to the case illustrated in FIG. 22B so that the supply amount of the process gas and purge time may be reduced.

Figure 12A:
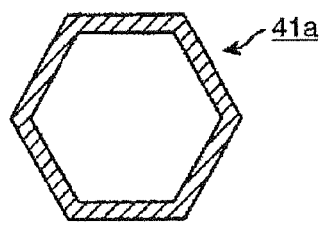
FIGS. 12A, 12B, 12C, 12D, 12E, 12F, 12G are modified examples of the gas supply nozzle.

Furthermore, the shape of gas supply nozzle 41 and/or gas supply hole 411 is not limited to the illustrated examples. For example, as shown in FIG. 12A, gas supply nozzle 41a having the cross section along the horizontal direction of polygon may be adopted.

Figure 12B:
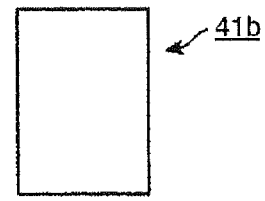
Figure 12C:
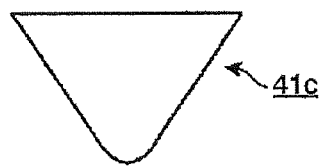
Figure 12D:
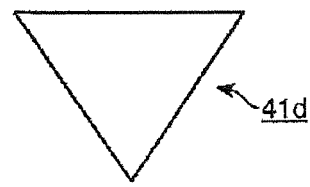
Figure 12E:
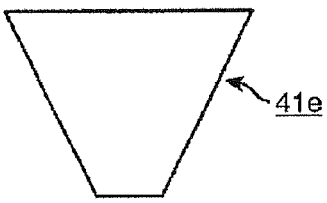

As shown in FIG. 12B, the side view of gas supply nozzle 41b may be a rectangular shape (for example, the overall shape is a cylinder or polygonal column), or gas supply nozzle 41c, 41d, 41e may be approximately a conic shape as shown in FIGS. 12C, 12D, 12E.

Figure 12F:
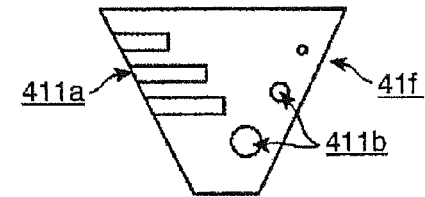

Also, as shown in FIG. 12F, gas supply holes 411a projected with a slit-type may be formed, or gas supply holes 411b of which the diameter of the opening varies depending on the position may be formed.

Figure 12G:
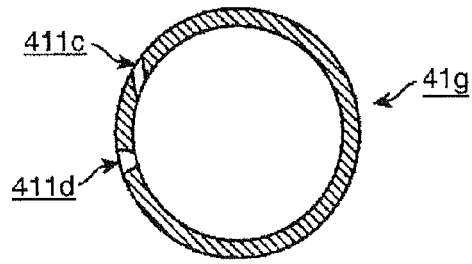

And, as shown in FIG. 12G, gas supply holes 411c may be formed with a slope with respect to the normal direction of the wall surface of gas supply nozzle 41g so that the processing gas can be supplied with a swirling operation. Additionally, a taper-type gas supply holes 411d may be formed so that the gas is supplied while the gas is spreading from the supply holes.

The various shapes of concave portion 422 and aspects of gas supply nozzles 41, 41a~41g may be selected appropriately based on, for example, the kind of the process gas and process condition, and inserted into gas supply apparatus 4.

As described above by referring to FIG. 1, ceiling board member 42 is detachable with respect to processing chamber 2. Also, as illustrated in FIG. 4, gas supply tube 43 is provided as detachable with respect to ceiling board member 42. For this reason, only the necessary parts may be replaced when concave portion 422 or gas supply nozzle 41 need to be changed into appropriate ones suitable for a new process, because the kind of process gas and/or the process condition has been changed, thereby reducing the modification cost of gas supply apparatus 4.

Figure 13:
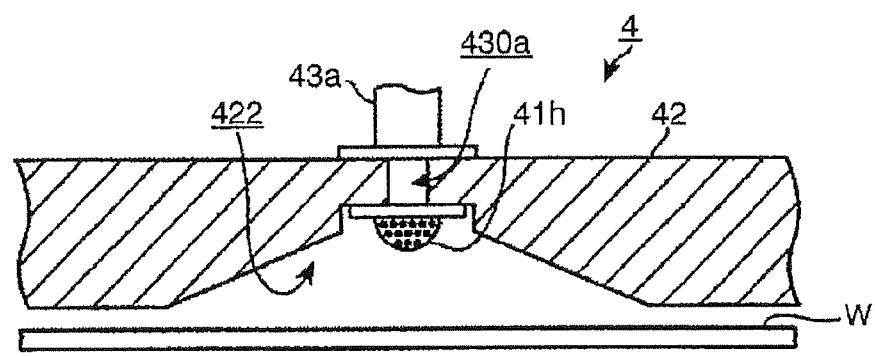
FIG. 13 is a second modified example of the gas supply device.
Figure 14:
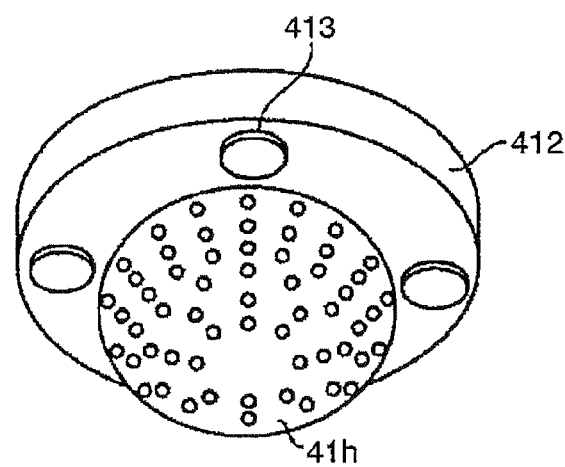
FIG. 14 is an expanded-perspective view illustrating a gas supply nozzle of the gas supply device according to the second modified example.

In particular, as illustrated in FIG. 4, gas supply nozzle 41 is smaller in size than ceiling board member 42, and can be simply detached along with gas supply tube 43. For this reason, for example, when the particles attached inside need to be cleaned regularly, processing chamber 2 needs not to be opened to detach the entire ceiling board member 42 so that the maintenance is convenient. The maintenance may be even more convenient if gas supply nozzle 41 is configured to be detachable from gas supply tube 43 by, for example, forming a screw hole on gas supply nozzle 41 and gas supply tube 43 to couple each other by a screw. Also, for example, as illustrated in FIGS. 13 and 14, gas supply nozzle 41h and gas supply tube 43a may be manufactured independently each other in gas supply apparatus 4. In this instance, for example, gas supply nozzle 41h and gas supply tube 43a may be connected via through-flow space 430a formed in ceiling board member 42. In this case, gas supply nozzle 41h, for example, may be fixed on the bottom surface of ceiling board member 42 with a bolt 413 through flange portion 412 provided in the rear-end portion.

Gas supply nozzle 41 with a type fixed to ceiling board member 42 may well be adopted as necessary.

Figure 15:
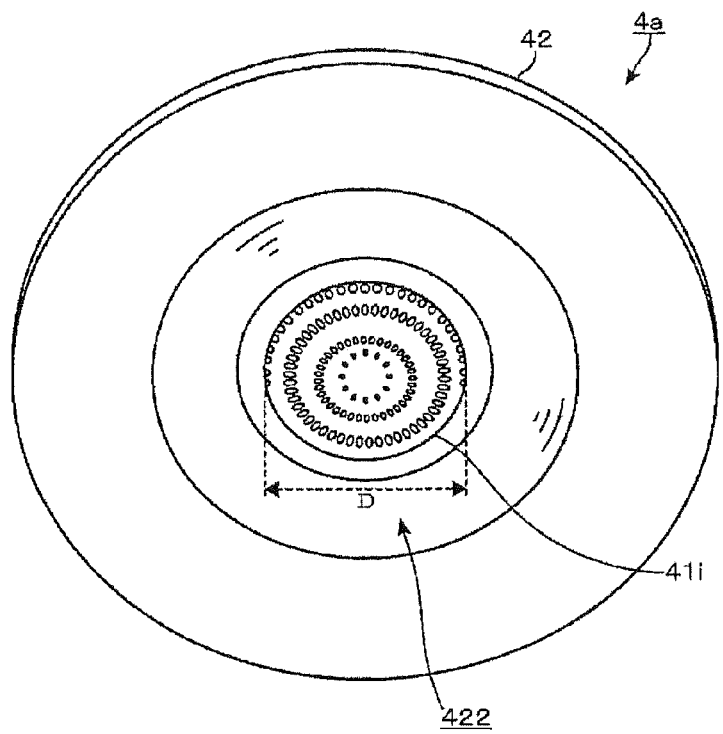
FIG. 15 is a perspective view of a gas supply device viewed from the bottom side according to a second embodiment.
Figure 16:
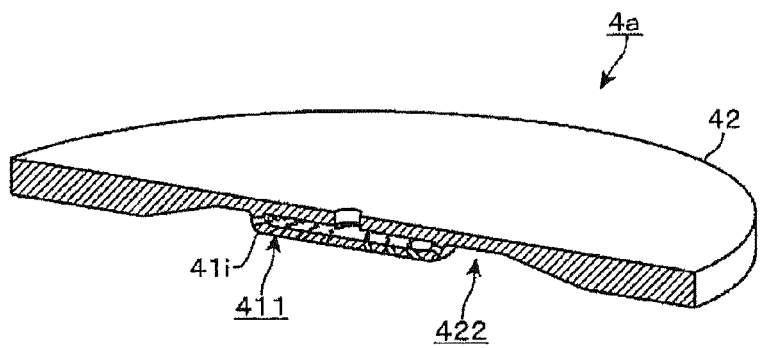
FIG. 16 is a cross-sectional perspective view of the gas supply device of FIG. 15.
Figure 17:
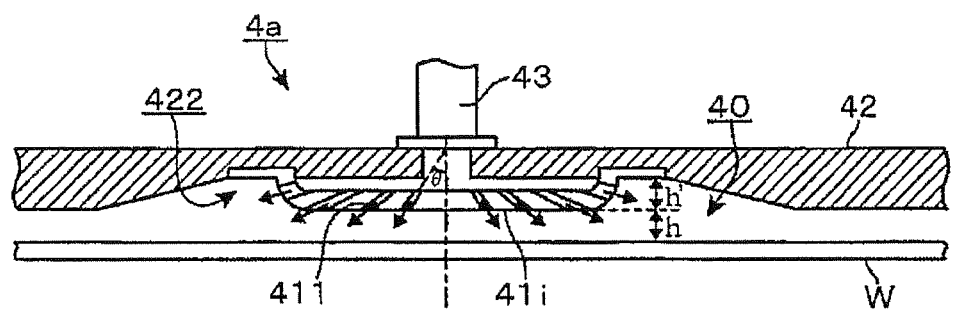
FIG. 17 is a cross-sectional view of the gas supply device of FIG. 15.

Referring to FIGS. 15 through 17, descriptions will be made regarding gas supply apparatus 4a as a second embodiment hereinafter. In each of FIGS. 15 through 17, the elements having the same functionalities as in the first embodiment as shown in FIGS. 1 through 10 are numbered with the same numerals.

As shown in FIGS. 15 to 17, gas supply device 4a according to the second embodiment is different from gas supply nozzle 41 of the first embodiment in that the shape of the main body of gas supply nozzle 41i is a flat-disc type while the shape of gas supply nozzle 41 is hemisphere type in gas supply apparatus 4 of the first embodiment.

Specifically, in gas supply apparatus 4a according to the second embodiment, a flat-disc type gas supply nozzle 41i is projected from the peak of concave portion 422 formed at the lower portion of ceiling member 42 toward loading board 3. The diameter D and height h' of the flat-disc type gas supply nozzle 41i are 100 mm and 10 mm, respectively. A plurality of gas supply holes 411 are formed at the bottom surface and side surface of the flat-disc type gas supply nozzle 41i, the process gas supplied from gas supply tube 43 is supplied to diffusion space 40 through gas supply holes 411, as illustrated in FIG. 17.

By forming gas supply nozzle 41i as a flat-disc type, for example, the entire gas supply nozzle 41i may be readily received in concave portion 422 even if the volume of diffusion space 40 is made small thereby reducing the gas supply time and purge time. Specifically, for example, in gas supply apparatus 4 as illustrated in FIG. 11D, the hemisphere type gas supply nozzle 41 is projected from the peak portion of concave portion 422 to make the volume of diffusion space 40 smaller. In contrast, as illustrated in FIG. 17, since it is possible to make the height starting from the peak of concave portion 422 to the bottom surface of gas supply nozzle 41i (indicated as h' in the figure), and the height starting from the bottom surface of gas supply nozzle 41i to wafer W (indicated as h in the figure) can be made smaller, the volume of diffusion space 40 may be further reduced. When gas supply nozzle 41 is projected from concave portion 422 as illustrated in FIG. 11D, the gap between the bottom surface of gas supply nozzle 41 and the surface of wafer W may be adjusted to have a value within a predetermined range.

Moreover, since gas supply nozzle 41i is formed as a flat shape, the surface area of nozzle 41i may be increased while suppressing the volume increasing of inside gas supply nozzle 41i. As a result, for example, since the size of gas supply nozzle 41i and gas supply tube 43 become small as compared to the gas shower head, it becomes easier to substitute gas of inside. Meanwhile, the process gas may be supplied to wafer W from an extended surface as compared to gas supply nozzle 41 of hemisphere type. In particular, in gas supply nozzle 41a of the present embodiment, gas supply holes 411 are formed not only at the bottom surface but also at the side surface so that the supply area of the process gas is become even wider. As a result, the process gas may be diffused to even wider area along the widening surface of concave portion 422. In other words, gas supply nozzle 41i formed with a flat shape has an advantage of the nozzle where the inner volume of the nozzle is relatively small as well as an advantage of the gas shower head where the supply surface of the process gas is relatively wide so that the supply of the process gas and purge process can be performed within a short time period.

As illustrated in FIG. 17, the plurality of gas supply holes 411 are not formed on the central area of the bottom surface of gas supply nozzle 41i but formed on the outer side area, as in the case of gas supply nozzle 41 of the first embodiment.

For this reason, the angle θ between gas supply holes 411 and the central shaft that passes the center of the bottom surface of the disc plate is at least 10° or more, for example, 35° or more. With these constitution, the flow of the process gas is blocked at the central portion of the bottom surface of gas supply nozzle 41i (right below gas supply tube 43) so that the strength of the process gas spurted out from gas supply holes 411 disposed in central area is weakened. In contrast, at the circumferential area of gas supply nozzle 41i, the inner pressure of the nozzle 41i is increased because the gas flow is blocked at the central area thereby strengthening the flow of the process gas spurted from gas supply holes 411 disposed in circumferential area. Therefore, the process gas may be spurted out uniformly from the entire gas supply holes 411.

Also, similar to gas supply nozzle 41 of the first embodiment, the number of openings per unit area is smaller near the front-end side of gas supply nozzle 41i (at this example, the central area of the bottom surface of nozzle 41i), and larger near the rear-end side (at this example, the circumferential area of the bottom surface of nozzle 41i). Therefore, the concentration of the process gas that arrives at the surface of wafer W may be uniform throughout the surface of wafer W. Here, when each of the openings of gas supply holes 411 can be different each other, the opening ratio at the front-end side and the rear-end side can be adjusted to the ratio of the projected area P1:P2. This is similar to gas supply nozzle 41 of the first embodiment.

Also, gas supply nozzle 41i formed with a flat shape is not limited to a flat disc type when the plane shape is viewed from the bottom surface side, as illustrated in FIG. 15. For example, the plan shape of gas supply nozzle 41i may be a polygonal or an elliptical.

Besides, gas supply holes 411 are not limited to the case where the holes are formed on the bottom surface and side surface of gas supply nozzle 41i. For example, the scope of the present invention includes the case where, for example, gas supply holes 411 are formed only on the bottom surface of the main body of the nozzle. In this instance, the front-end side of gas supply holes 411 formed on the bottom surface may be slightly projected from the bottom surface of the main body of the nozzle and the gas may be spurted out toward the bottom of concave portion 422 where the end portion is widening. As a result, the gas may be supplied almost equally to the case where gas supply holes are formed on the side surface of the main body of the nozzle.

In film forming apparatus 1 described above, it is described that the STO film is formed using Sr raw material gas, Ti raw material gas and ozone gas as a processing gas. However, the kind of films that can be formed with film forming apparatus 1 is not limited to this. For example, film forming apparatus 1 may be applied to the process of forming zirconium oxide film using TEMAZ, ozone gas or water vapor as a process gas. Also the kind of process that can be applied to film forming apparatus 1 is not limited to ALD and MLD, but may be a common type CVD process that supplies the source gas and reaction gas continuously.

In the embodiments described above, semiconductor wafer is used as an object to be processed. However, a glass substrate, an LCD substrate and a ceramic substrate may also be used for the present invention.

EXEMPLARY EMBODIMENTS

Simulation 1

A model has been prepared for gas supply apparatus 4 according to the first embodiment, and a simulation has been performed regarding the concentration distribution of the processing gas in the processing atmosphere when each of the processing gas and purge gas is supplied, respectively.

A. Simulation Condition

Toluene which is the solvent of the Sr raw material gas and Ti raw material gas is volatilized in Ar gas, and the resulting gas has become the model gas of the processing. The temperature of the processing atmosphere was 230° C., and the exit pressure of the processing atmosphere was 45 Pa.

Exemplary Embodiment 1-1

Figure 18:
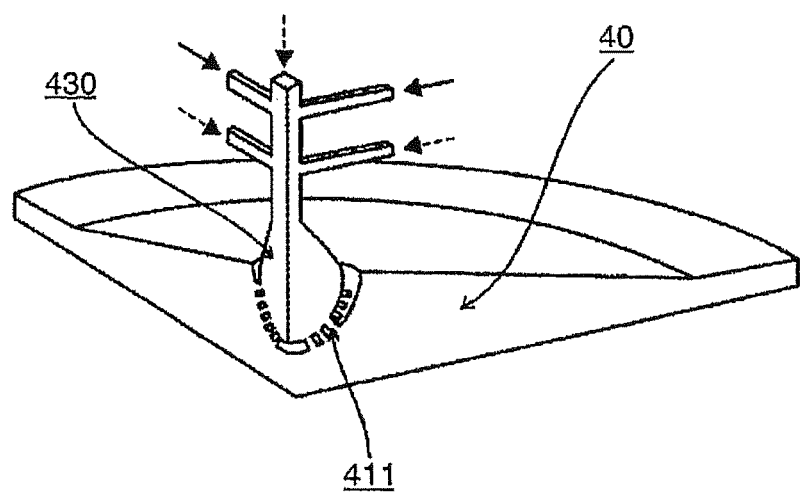
FIG. 18 is a perspective view of a model space used for simulation of the embodiments.

As illustrated in FIG. 18, in film forming apparatus 1 according to the embodiments as described above that includes through-flow space 430 where the gases flow, the inside of gas supply nozzle 41, and diffusion space 40 (processing atmosphere), a model space has been prepared along the circumferential direction by dividing the circumferential area into four (4) with the central position of the space as a reference. And then, the process gas has been supplied so that a simulation has been conducted by increasing the concentration of the process gas from 0 vol % to 4.0 vol %.

Here, the gas concentration distribution has been obtained after 0.01 second has been elapsed since the process gas supply begins. When the process gas is supplied, a counter gas is supplied simultaneously with the process gas to prevent the reverse flow of the gas. Referring to FIG. 18, the process gas is supplied from the position indicated as the line arrow, and the counter gas is supplied from the position indicated as the dotted-line arrow.

Supply Amount of Process Gas:
Toluene 0.1 g/min.
Argon gas 500 mL/min (sccm)
Supply Amount of Counter Gas
Argon gas 1000 mL/min (sccm)

Exemplary Embodiment 1-2

The supply of the process gas begins with the same condition as in the exemplary embodiment 1-1, and the gas concentration distribution has been obtained after 0.1 second has been elapsed since the process gas supply begins.

Exemplary Embodiment 2-1

The process gas has been supplied to the model space with the conditions of exemplary embodiments 1-1 and 1-2, and a purge gas is supplied to the model space thereafter. Then, a simulation has been performed by decreasing the concentration of the process gas from 4.0 vol % to 0 vol %. The concentration distribution of the process gas has been obtained after 0.01 second since the process gas supply begins. Ar gas has been supplied as a purge gas from both of the line (hereinafter, process gas line) and dotted-line (hereinafter, counter gas line) in FIG. 18.

Supply Amount of Process Gas Line
Argon gas 500 mL/min (sccm)
Supply Amount of Counter Gas Line
Argon gas 1500 mL/min (sccm)

Exemplary Embodiment 2-2

The process gas concentration distribution has been obtained after 0.1 second is elapsed since the supply of the process gas begins with the same condition of exemplary embodiment 2-1.

Exemplary Embodiment 2-3

The process gas concentration distribution has been obtained after 0.5 second is elapsed since the supply of the process gas begins with the same condition of exemplary embodiment 2-1.

B. Simulation Result

Figure 19A:
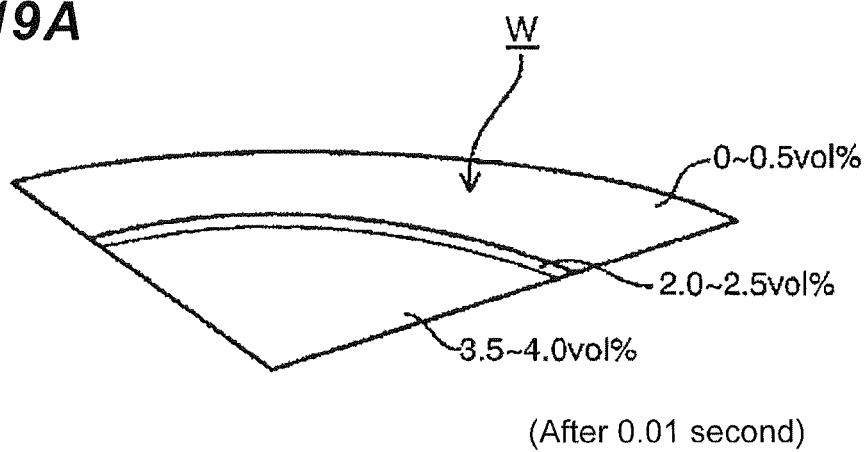
FIGS. 19A, 19B are the result of a first embodiment.
Figure 19B:
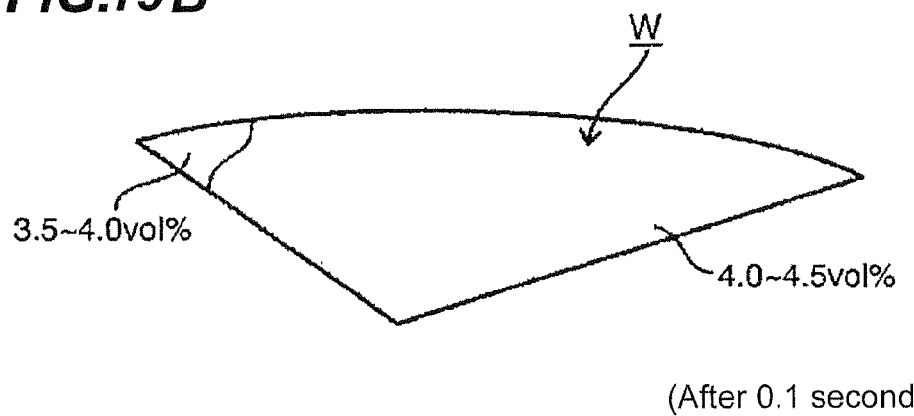
Figure 20A:
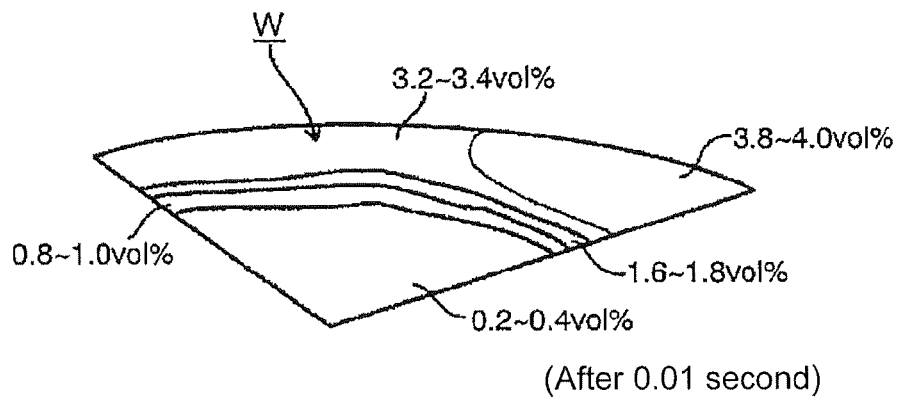
FIGS. 20A, 20B, 20 C are the result of a second embodiment.
Figure 20B:
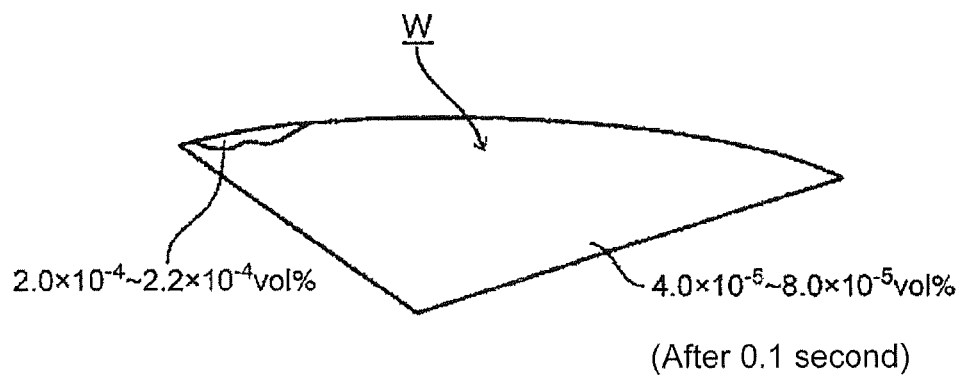
Figure 20C:
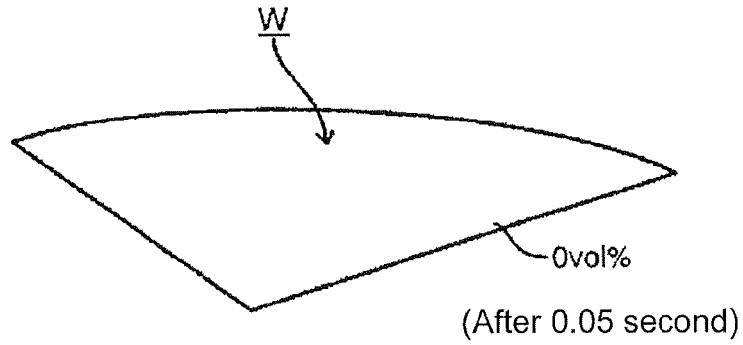

FIGS. 19A and 19B each represents the simulation result of exemplary embodiments 1-1 and 1-2, respectively. Each of FIGS. 20A, 20B, 20C represents the simulation results of exemplary embodiments 2-1, 2-2, 2-3, respectively.

In the figures, the concentration distribution at the bottom surface (which corresponds to the surface of wafer W) of the model surface as shown in FIG. 18 is represented as an equal-concentration line division. The numerals in the figures represent the range of gas concentration (vol %) at the corresponding division.

Although, the real simulation results are outputted with a color display where the concentration distribution is represented by color difference, the concentration distributions are roughly represented in the figures. For example, the discontinuing portions of the concentration range between adjacent regions indicate that there is actually a drastic difference in the concentration between the regions, but does not indicate that the concentration distribution exists sparsely.

As illustrated in FIGS. 19A, 19B, according to the results from exemplary embodiments 1-1 and 1-2, the process gas concentration increases from 3.5 vol %~4.0 vol % at approximately half of the surface of wafer W at 0.01 second after the supply of the gas begins. And, the process gas concentration increases up to the targeted value of 4.0 vol % throughout the entire area of wafer W at 0.1 second after the supply of the gas begins. That is, the process gas can be supplied uniformly within a short time thereby confirming the practicality.

As illustrated in FIGS. 20A, 20B, 20C, according to the results from exemplary embodiments 2-1, 2-2, 2-3, the concentration of the process gas decreases to almost 0% ($4.0 \times 10^{-5} \sim 8.0 \times 20^{-5}$) at 0.1 second after the supply of purge gas begins (exemplary embodiment 2-2 of FIG. 20B), thereby confirming that an almost complete purge can be performed within a short time.

Based on the above results, it can be confirmed that a uniform supply of the process gas and a purge can be performed within a short time using process chamber 2.

Simulation 2

A model is prepared for gas supply apparatus 4a according to the second embodiment, and a simulation is performed for the process gas concentration distribution in the process atmosphere when the process gas is supplied. The result is then compared with the result of the first embodiment.

A. Simulation Condition

The model gas, the temperature and pressure are the same as in simulation 1.

Exemplary Embodiment 3-1

A model space is prepared for gas supply apparatus 4a according to the second embodiment as shown in FIGS. 15 through 17 with a similar concept to FIG. 18. Then, a simulation is performed by increasing the concentration of the process gas 0.0 vol % to 40 vol %. Here, the concentration distribution of the process gas has been obtained after 0.007 second since the supply of the process gas begins. The conditions such as the supply amount of the process gas and the counter gas is the same as in exemplary embodiment 1-1.

Exemplary Embodiment 3-2

The process gas concentration distribution has been obtained after 0.01 second is elapsed since the supply of the process gas begins with the same condition of exemplary embodiment 3-1.

Exemplary Embodiment 3-3

The process gas concentration distribution has been obtained after 0.02 second is elapsed since the supply of the process gas begins with the same condition of exemplary embodiment 3-1.

B. Simulation Result

Figure 21A:
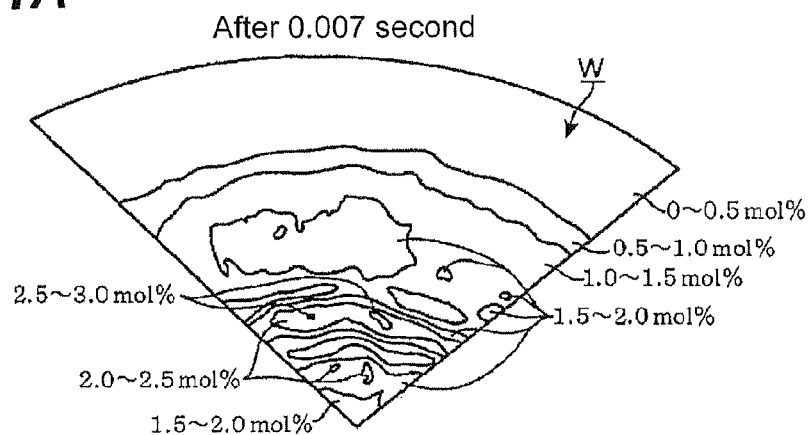
FIGS. 21A, 21B, 21C are the result of a third embodiment.
Figure 21B:
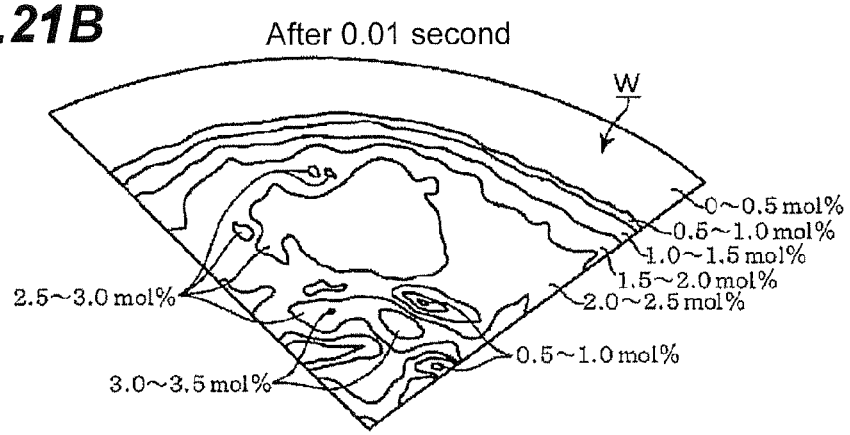
Figure 21C:
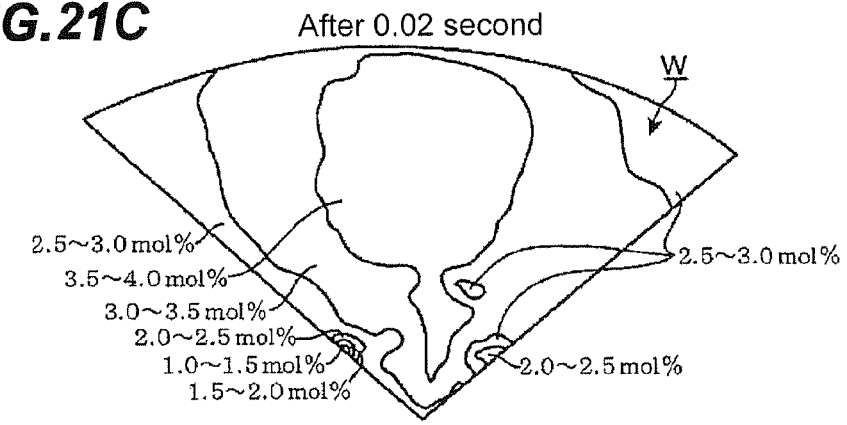

The simulation results for exemplary embodiments 3-1, 3-2, 3-3 are illustrated in FIG. 21A, 21B, 21C. In the figures, similarly to FIGS. 19A through 20C, the concentration distribution at the bottom surface (which corresponds to the surface of wafer W) of the model space is represented as an equal-concentration line division. In an effort to avoid the confusion, some of the concentration ranges are omitted from FIGS. 21A, 21B.

As illustrated in FIGS. 21A, 21B, 21C, according to the results from exemplary embodiments 3-1, 3-2, 3-3, a 1.5 vol %~2.0 vol % area appears at 0.007 second after the supply of the process gas begins, and the concentration of the area increases to 2.5 vol %~3.0 vol % at 0.01 second after the supply of the processing gas begins. Also, at 0.02 second after the supply of the process gas begins, the concentration of the process gas increases to the targeted value of 4.0 vol % over approximately ⅓ of the area, and there exist almost no area that shows the concentration of lower than 1.0 vol %. And, although not shown in the figures, it is confirmed that at 0.1 second after the supply of the process gas begins, the concentration of the process gas increases up to the targeted value of 4.0 vol % over almost every areas of the surface of wafer W. Based on these results, gas supply apparatus 4a of the second embodiment can be regarded as having a sufficient practicality as in the first embodiment

What is claimed is:

1. A gas supply device for supplying a process gas to a substrate comprising:
   a loading board provided in a processing chamber configured to receive the substrate;
   a top plate member provided with a concave portion having a shape that end portion thereof is widening toward the loading board to form a gas diffusion space at a position that faces the substrate on the loading board; and
   a gas supply nozzle projected from a peak position to inside of the concave portion, and having a plurality of gas supply holes along a circumferential direction of the gas supply nozzle,
   wherein the gas supply nozzle is configured in such a way that the number of openings in the plurality of gas supply holes per unit area of the gas supply nozzle increases along the direction from a front-end side to a rear-end side.

2. The gas supply device of claim 1, wherein the concave portion is formed as a taper plane spreading gradually toward the loading board.

3. The gas supply device of claim 1, wherein the gas supply nozzle is provided at a front-end part of a gas supply tube that penetrates the top plate member, and the gas supply nozzle and the gas supply tube are common to a plurality of the process gases.

4. The gas supply device of claim 1, wherein the gas supply tube is detachable with respect to the top plate member.

5. The gas supply device of claim 1, wherein the gas supply hole is opened having at least a slope of ten degrees according to central axis of the recess.

6. A film forming apparatus for forming a thin film on a surface of a substrate, the film forming apparatus comprising:
   a processing chamber having a loading board configured to receive the substrate; and
   the gas supply device according to claim 1,
   wherein the gas supply device supplies a plurality of different process gases to the substrate mounted on the loading board thereby forming the thin film on the substrate by reacting the plurality of different process gases.

7. The film forming apparatus of claim 6 further comprising a controller configured to output a control signal to each part of the apparatus to perform a step of supplying a raw material gas as a first process gas to be absorbed on the substrate, and a step of supplying a reaction gas as a second process gas that reacts with the raw material gas to produce a reaction product on the substrate, wherein the two steps are performed alternately and a purging process is performed in between the two steps using a purge gas.

8. The film forming apparatus of claim 6, further comprising a vacuum exhaust path configured to communicate with a gas diffusion space of the gas supply device and exhaust atmosphere of the gas diffusion space to a side surface.

9. The film forming apparatus of claim 6, wherein a projected area of the openings of loading board side of the concave portion covers 30% or more of the substrate area.

* * * * *